United States Patent
Lee et al.

(10) Patent No.: US 12,018,039 B2
(45) Date of Patent: Jun. 25, 2024

(54) BORON COMPOUND, AND ORGANIC LIGHT-EMITTING DIODE COMPRISING SAME

(71) Applicant: SFC CO., LTD., Cheongju-si (KR)

(72) Inventors: Se-Jin Lee, Cheongju-si (KR);
Bong-Hyang Lee, Cheongju-si (KR);
Taejung Yu, Cheongju-si (KR);
Yeong-Tae Choi, Cheongju-si (KR);
Kyung-Tae Kim, Cheongju-si (KR)

(73) Assignee: SFC CO., LTD., Cheongju-si (KR)

( * ) Notice: Subject to any disclaimer, the term of this patent is extended or adjusted under 35 U.S.C. 154(b) by 607 days.

(21) Appl. No.: 17/291,594

(22) PCT Filed: Nov. 14, 2019

(86) PCT No.: PCT/KR2019/015555
§ 371 (c)(1),
(2) Date: May 5, 2021

(87) PCT Pub. No.: WO2020/101395
PCT Pub. Date: May 22, 2020

(65) Prior Publication Data
US 2021/0403490 A1     Dec. 30, 2021

(30) Foreign Application Priority Data
Nov. 16, 2018   (KR) ........................ 10-2018-0141977

(51) Int. Cl.
*C07F 7/08*     (2006.01)
*H01L 51/00*    (2006.01)
(Continued)

(52) U.S. Cl.
CPC ......... *C07F 7/0816* (2013.01); *H10K 85/322* (2023.02); *H10K 85/40* (2023.02);
(Continued)

(58) Field of Classification Search
None
See application file for complete search history.

(56) References Cited

U.S. PATENT DOCUMENTS 11,299,502 B2 *   4/2022   Kim ................... H10K 85/6572
2021/0317147 A1 * 10/2021  Hong .................... C09K 11/06

FOREIGN PATENT DOCUMENTS

| CN | 107417715 A | 12/2017 |
|---|---|---|
| JP | 2012234873 A | 11/2012 |

(Continued)

OTHER PUBLICATIONS

International Search Report of PCT/KR2019/015555, Feb. 27, 2020, English translation.
(Continued)

*Primary Examiner* — Tae H Yoon
(74) *Attorney, Agent, or Firm* — STIP Law Group, LLC

(57) ABSTRACT

The present disclosure relates to a boron compound useful in an organic light-emitting diode and an organic light-emitting diode comprising same and, more particularly, to a boron compound represented by [Chemical Formula A], wherein [Chemical Formula A] and [Chemical Formula C] are as defined in the description.

18 Claims, 1 Drawing Sheet

(51) Int. Cl.
   *H10K 85/30* (2023.01)
   *H10K 85/40* (2023.01)
   *H10K 85/60* (2023.01)
   *H10K 50/11* (2023.01)

(52) U.S. Cl.
   CPC ......... *H10K 85/626* (2023.02); *H10K 85/636* (2023.02); *H10K 50/11* (2023.02)

(56) References Cited

FOREIGN PATENT DOCUMENTS

| | | | |
|---|---|---|---|
| JP | 5724588 B2 | * | 5/2015 |
| JP | WO 2017/188111 A1 | * | 11/2017 |
| KR | 20160119683 A | | 10/2016 |
| KR | 20170130434 A | | 11/2017 |
| KR | 20180122298 A | | 11/2018 |
| TW | 201111474 A | * | 4/2011 |
| WO | WO 2016/152418 A1 | * | 9/2016 |
| WO | WO2016152544 A1 | | 9/2016 |
| WO | WO2017188111 A1 | | 11/2017 |

OTHER PUBLICATIONS

Chemical Abstract Compound, STN express, RN: 1415003-97-2, Dec. 2012, ACS, Washington DC, USA.

* cited by examiner

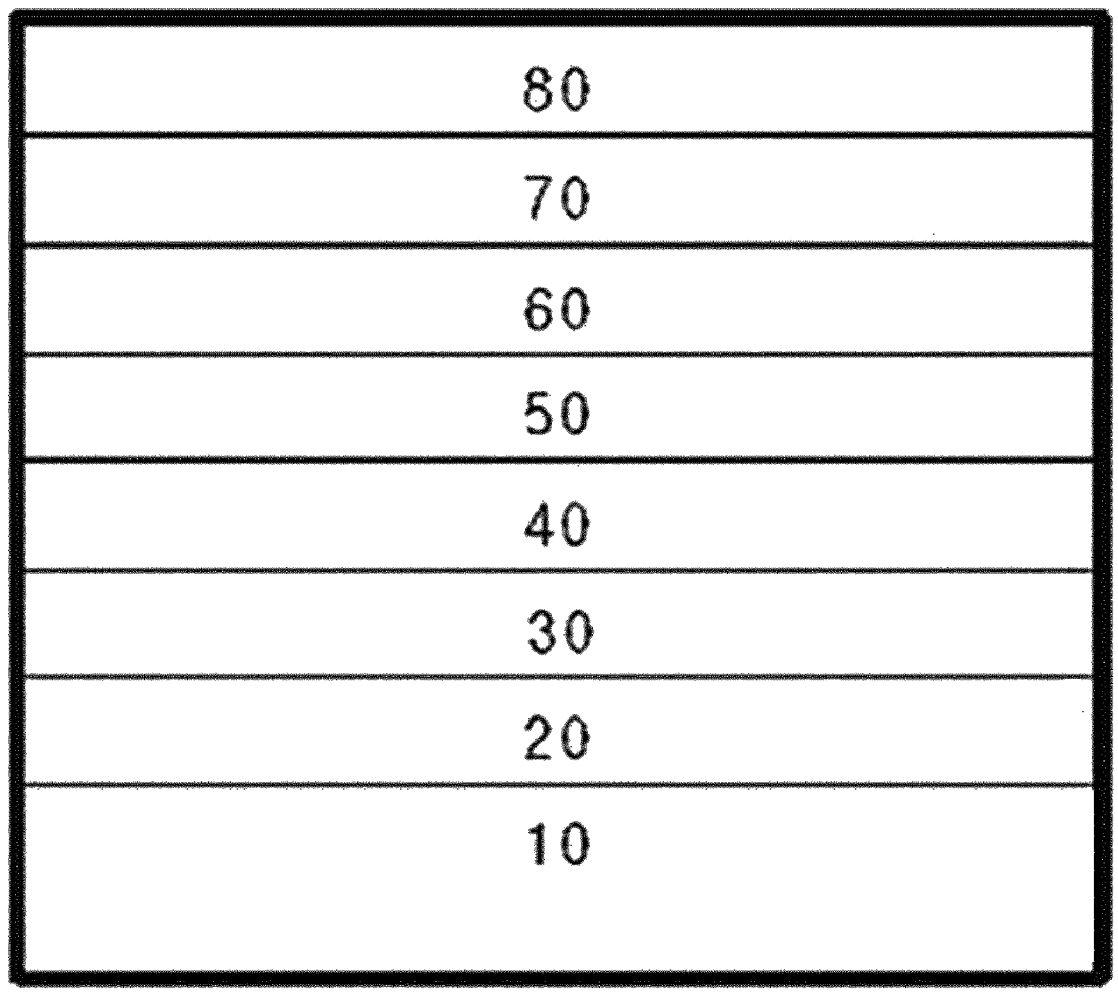

BORON COMPOUND, AND ORGANIC LIGHT-EMITTING DIODE COMPRISING SAME

CROSS-REFERENCE TO RELATED APPLICATIONS

This application is the U.S. National Phase under 35 U.S.C. § 371 of International Application No. PCT/KR2019/015555 filed on Nov. 14, 2019, which in turn claims the benefit of Korean Application No. 10-2018-0141977 filed on Nov. 16, 2018, the disclosures of which are incorporated by reference into the present application.

TECHNICAL FIELD

The present disclosure relates to a novel boron compound useful for an organic light-emitting diode and, more particularly, to a novel boron compound that can be used as a dopant material in an organic light-emitting diode and allow for excellent diode characteristics including high luminous efficiency and low driving voltage, and an organic light-emitting diode comprising the same.

BACKGROUND ART

Organic light-emitting diodes (OLEDs), based on self-luminescence, are used to create digital displays with the advantage of having a wide viewing angle and being able to be made thinner and lighter than liquid crystal displays. In addition, an OLED display exhibits a very fast response time. Accordingly, OLEDs find applications in the full color display field or the illumination field.

In general, the term "organic light-emitting phenomenon" refers to a phenomenon in which electrical energy is converted to light energy by means of an organic material. An organic light-emitting diode using the organic light-emitting phenomenon has a structure usually including an anode, a cathode, and an organic material layer interposed therebetween. In this regard, the organic material layer may have, for the most part, a multilayer structure consisting of different materials, for example, a hole injection layer, a hole transport layer, a light-emitting layer, an electron transport layer, and an electron injection layer in order to enhance the efficiency and stability of the organic light-emitting diode. In the organic light-emitting diode having such a structure, application of a voltage between the two electrodes injects a hole from the anode and an electron from the cathode to the organic layer. In the luminescent zone, the hole and the electron recombine to produce an exciton. When the exciton returns to the ground state from the excited state, the molecule of the organic layer emits light. Such an organic light-emitting diode is known to have characteristics such as self-luminescence, high luminance, high efficiency, low driving voltage, a wide viewing angle, high contrast, and high-speed response.

Materials used as organic layers in OLEDs may be divided according to functions into luminescent materials and charge transport materials, for example, a hole injection material, a hole transport material, an electron transport material, and an electron injection material and, as needed, further into an electron-blocking material or a hole-blocking material.

As for the luminescent materials, there are two main families of OLED: those based on small molecules and those employing polymers. The light-emitting mechanism forms the basis of classification of luminescent materials as fluorescent and phosphorescent materials, which use excitons in singlet and triplet states, respectively.

When a single material is employed as the luminescent material, intermolecular actions cause the maximum luminescence wavelength to shift toward a longer wavelength, resulting in a reduction in color purity and luminous efficiency due to light attenuation. In this regard, a host-dopant system may be used as a luminescent material so as to increase the color purity and the luminous efficiency through energy transfer.

This is based on the principle whereby, when a dopant which is smaller in energy band gap than a host forming a light-emitting layer is added in a small amount to the light-emitting layer, excitons are generated from the light-emitting layer and transported to the dopant, emitting light at high efficiency. Here, light with desired wavelengths can be obtained depending on the kind of the dopant because the wavelength of the host moves to the wavelength range of the dopant.

With regard to related art pertaining to the use of boron compounds as dopant compounds, reference may be made to Korean Patent No. 10-2016-0119683 A (issued Oct. 14, 2016), which discloses an organic light-emitting diode employing a novel polycyclic aromatic compound in which multiple aromatic rings are connected via boron and oxygen atoms. In addition, International Patent No. WO 2017/188111 (Nov. 2, 2017) disclosed an organic light emitting diode employing a light emitting layer in which a compound structured to connect polycyclic aromatic rings via boron and nitrogen atoms and an anthracene derivative are employed.

Despite a variety of kinds of compounds prepared for use in light emitting layers in organic light emitting diodes including the related arts, there is still a continuing need to develop a novel compound that allows an OLED to be stably driven at a lower voltage and exhibits high efficiency, and an OLED including the same.

DISCLOSURE

Technical Problem

Therefore, an aspect of the present disclosure is to provide a boron compound having a novel structure which can be used as a dopant material in a light-emitting layer of an organic light-emitting diode.

In addition, another aspect of the present invention is to provide an organic light-emitting diode (OLED) having the boron compound applied as a dopant material therein and exhibiting excellent diode characteristics including high luminous efficiency and low-voltage driving.

Technical Solution

In order to accomplish the purposes, the present disclosure provides a boron compound represented by the following Chemical Formula A:

[Chemical Formula A]

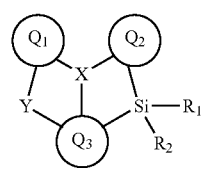

wherein, $Q_1$ to $Q_3$, which may be the same or different, are each independently a substituted or unsubstituted aromatic hydrocarbon ring of 6 to 50 carbon atoms, or a substituted or unsubstituted heteroaromatic ring of 2 to 50 carbon atoms, Y is any one selected from N—$R_3$, $CR_4R_5$, O, S, and Se, X is any one selected from B, P, and P═O, and $R_1$ to $R_5$, which may be the same or different, are each independently any one selected from a hydrogen atom, a deuterium, a substituted or unsubstituted alkyl of 1 to 30 carbon atoms, a substituted or unsubstituted aryl of 6 to 50 carbon atoms, a substituted or unsubstituted cycloalkyl of 3 to 30 carbon atoms, a substituted or unsubstituted heteroaryl of 2 to 50 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a substituted or unsubstituted arylamine of 5 to 30 carbon atoms, a substituted or unsubstituted alkylsilyl of 1 to 30 carbon atoms, a substituted or unsubstituted arylsilyl of 5 to 30 carbon atoms, a nitro, a cyano, and a halogen, wherein $R_1$ and $R_2$ may be connected to each other to form an additional mono- or polycyclic aliphatic or aromatic ring, or may be connected to the $Q_2$ ring moiety or $Q_3$ ring moiety to form an additional mono- or polycyclic aliphatic or aromatic ring, $R_3$ to $R_5$ may each be connected to the $Q_1$ ring moiety or $Q_3$ ring moiety to form an additional mono- or polycyclic aliphatic or aromatic ring, and $R_4$ and $R_5$ may be connected to each other to form an additional mono- or polycyclic aliphatic or aromatic ring.

Advantageous Effects

When used as a dopant material, the novel compound according to the present disclosure allows for the provision of an organic light-emitting diode that can be driven at a lower voltage with improved luminous efficiency, compared to conventional organic light-emitting diodes.

BRIEF DESCRIPTION OF THE DRAWINGS

FIG. 1 is a schematic diagram of an organic light-emitting diode according to some embodiments of the present disclosure.

MODE FOR CARRYING OUT THE INVENTION

Below, a detailed description will be given of the present disclosure. In each drawing of the present disclosure, sizes or scales of components may be enlarged or reduced from their actual sizes or scales for better illustration, and known components may not be depicted therein to clearly show features of the present disclosure. Therefore, the present disclosure is not limited to the drawings. When describing the principle of the embodiments of the present disclosure in detail, details of well-known functions and features may be omitted to avoid unnecessarily obscuring the presented embodiments.

In drawings, for convenience of description, sizes of components may be exaggerated for clarity. For example, since sizes and thicknesses of components in drawings are arbitrarily shown for convenience of description, the sizes and thicknesses are not limited thereto. Furthermore, throughout the description, the terms "on" and "over" are used to refer to the relative positioning, and mean not only that one component or layer is directly disposed on another component or layer but also that one component or layer is indirectly disposed on another component or layer with a further component or layer being interposed therebetween. Also, spatially relative terms, such as "below", "beneath", "lower", and "between" may be used herein for ease of description to refer to the relative positioning.

Throughout the specification, when a portion may "include" a certain constituent element, unless explicitly described to the contrary, it may not be construed to exclude another constituent element but may be construed to further include other constituent elements. Further, throughout the specification, the word "on" means positioning on or below the object portion, but does not essentially mean positioning on the lower side of the object portion based on a gravity direction.

The present disclosure provides a boron compound represented by the following Chemical Formula A:

[Chemical Formula A]

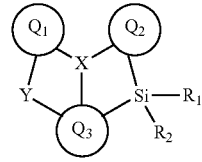

wherein, $Q_1$ to $Q_3$, which may be the same or different, are each independently a substituted or unsubstituted aromatic hydrocarbon ring of 6 to 50 carbon atoms, or a substituted or unsubstituted heteroaromatic ring of 2 to 50 carbon atoms, Y is any one selected from N—$R_3$, $CR_4R_5$, O, S, and Se, X is any one selected from B, P, and P═O, and $R_1$ to $R_5$, which may be the same or different, are each independently any one selected from a hydrogen atom, a deuterium, a substituted or unsubstituted alkyl of 1 to 30 carbon atoms, a substituted or unsubstituted aryl of 6 to 50 carbon atoms, a substituted or unsubstituted cycloalkyl of 3 to 30 carbon atoms, a substituted or unsubstituted heteroaryl of 2 to 50 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a substituted or unsubstituted arylamine of 5 to 30 carbon atoms, a substituted or unsubstituted alkylsilyl of 1 to 30 carbon atoms, a substituted or unsubstituted arylsilyl of 5 to 30 carbon atoms, a nitro, a cyano, and a halogen, wherein $R_1$ and $R_2$ may be connected to each other to form an additional mono- or polycyclic aliphatic or aromatic ring, or may be connected to the $Q_2$ ring moiety or $Q_3$ ring moiety to form an additional mono- or polycyclic aliphatic or aromatic ring, $R_3$ to $R_5$ may each be connected to the $Q_1$ ring moiety or $Q_3$ ring moiety to form an additional mono- or polycyclic aliphatic or aromatic ring, and $R_4$ and $R_5$ may be connected to each other to form an additional mono- or polycyclic aliphatic or aromatic ring, wherein, the term "substituted" in the expression "substituted or unsubstituted" used for compounds of Chemical Formulas A means having at least one substituent selected from the group consisting of a deuterium atom, a cyano, a halogen, a hydroxy, a nitro, an alkyl of 1 to 24 carbon atoms, a halogenated alkyl of 1 to 24 carbon atoms, an alkenyl of 2 to 24 carbon atoms, an alkynyl of 2 to 24 carbon atoms, a heteroalkyl of 1 to 24 carbon atoms, an aryl of 6 to 24 carbon atoms, an arylalkyl of 7 to 24 carbon atoms, an alkylaryl of 7 to 24 carbon atoms, a heteroaryl of 2 to 50 carbon atoms, a heteroarylalkyl of 2 to 24 carbon atoms, an alkoxy of 1 to 24 carbon atoms, an alkylamino of 1 to 24 carbon atoms, an arylamino of 6 to 24 carbon atoms, a heteroarylamino of 1 to 24 carbon atoms, an alkylsilyl of 1 to 24 carbon atoms, an arylsilyl of 6 to 24 carbon atoms, and an aryloxy of 6 to 24 carbon atoms.

The expression indicating the number of carbon atoms, such as "a substituted or unsubstituted alkyl of 1 to 30 carbon atoms", "a substituted or unsubstituted aryl of 6 to 50 carbon atoms", etc. means the total number of carbon atoms of, for example, the alkyl or aryl radical or moiety alone, exclusive of the number of carbon atoms of substituents attached thereto. For instance, a phenyl group with a butyl at the para position falls within the scope of an aryl of 6 carbon atoms, even though it is substituted with a butyl radical of 4 carbon atoms.

As used herein, the term "aryl" means an organic radical derived from an aromatic hydrocarbon by removing one hydrogen that is bonded to the aromatic hydrocarbon. The aromatic system may include a fused ring that is formed by adjacent substituents on the aryl radical.

Concrete examples of the aryl include phenyl, o-biphenyl, m-biphenyl, p-biphenyl, o-terphenyl, m-terphenyl, p-terphenyl, naphthyl, anthryl, phenanthryl, pyrenyl, indenyl, fluorenyl, tetrahydronaphthyl, perylenyl, chrysenyl, naphthacenyl, and fluoranthenyl. At least one hydrogen atom of the aryl may be substituted by a deuterium atom, a halogen atom, a hydroxy, a nitro, a cyano, a silyl, an amino (—$NH_2$, —NH(R), —N(R') (R") wherein R' and R" are each independently an alkyl of 1 to 10 carbon atoms, in this case, called "alkylamino"), an amidino, a hydrazine, a hydrazone, a carboxyl, a sulfonic acid, a phosphoric acid, an alkyl of 1 to 24 carbon atoms, a halogenated alkyl of 1 to 24 carbon atoms, an alkenyl of 1 to 24 carbon atoms, an alkynyl of 1 to 24 carbon atoms, a heteroalkyl of 1 to 24 carbon atoms, an aryl of 6 to 24 carbon atoms, an arylalkyl of 6 to 24 carbon atoms, a heteroaryl of 2 to 24 carbon atoms, or a heteroarylalkyl of 2 to 24 carbon atoms.

The term "heteroaryl substituent" used in the compound of the present disclosure refers to a hetero aromatic radical of 2 to 50 carbon atoms, preferably 2 to 24 carbon atoms, bearing 1 to 3 heteroatoms selected from among N, O, P, Si, S, Ge, Se, and Te. In the aromatic radical, two or more rings may be fused. One or more hydrogen atoms on the heteroaryl may be substituted by the same substituents as on the aryl.

In addition, the term "heteroaromatic ring", as used herein, refers to an aromatic hydrocarbon ring bearing at least one heteroatom as aromatic ring member. In the heteroaromatic ring, one to three carbon atoms of the aromatic hydrocarbon may be substituted by at least one selected particularly from N, O, P, Si, S, Ge, Se, and Te.

Examples of the alkyl substituent useful in the present disclosure include methyl, ethyl, propyl, isopropyl, isobutyl, sec-butyl, tert-butyl, pentyl, isoamyl, and hexyl. At least one hydrogen atom of the alkyl may be substituted by the same substituent as in the aryl.

Concrete examples of the alkoxy include methoxy, ethoxy, propoxy, isobutoxy, sec-butoxy, pentyloxy, iso-amyloxy, and hexyloxy. One or more hydrogen atoms on the alkoxy may be substituted by the same substituents as on the aryl.

Concrete examples of the silyl radicals used in the compounds of the present disclosure include trimethylsilyl, triethylsilyl, triphenylsilyl, trimethoxysilyl, dimethoxyphenylsilyl, diphenylmethylsilyl, diphenylvinlysilyl, methylcyclobutylsilyl, and dimethyl furylsilyl. One or more hydrogen atoms on the silyl may be substituted by the same substituents as on the aryl.

In the present disclosure, the boron compound represented by Chemical Formula A is characterized by the structure in which the $Q_1$ to $Q_3$ ring moieties, which are each independently a substituted or unsubstituted aromatic hydrocarbon ring of 6 to 50 carbon atoms or a substituted or unsubstituted heteroaromatic ring of 2 to 50 carbon atoms, are connected to one another via the central atom (X), with a linkage between the $Q_1$ and the $Q_3$ ring moiety through the linker Y and between the $Q_2$ and the $Q_3$ ring moiety through a silicon atom (Si).

In an embodiment, the linker Y in Chemical Formula A through which the $Q_1$ and $Q_3$ ring moieties are linked to each other may be N—$R_3$ wherein $R_3$ is as defined above.

In addition, when the linker Y in Chemical Formula A is N—$R_3$, $R_3$ may be a substituted or unsubstituted aryl of 6 to 50 carbon atoms or a substituted or unsubstituted heteroaryl of 2 to 50 carbon atoms.

Moreover, Y in Chemical Formulas A may be a linker represented by the following Chemical Formula A:

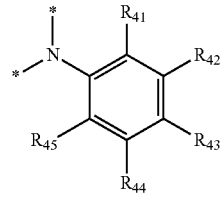

[Structural Formula A]

wherein "-*" denotes a bonding site at which the linker Y bonds to an aromatic carbon atom within the $Q_1$ and $Q_3$ ring moieties, $R_{41}$ to $R_{45}$, which may be the same or different, are each independently any one selected from a hydrogen atom, a deuterium atom, a substituted or unsubstituted alkyl of 1 to 30 carbon atoms, a substituted or unsubstituted aryl of 6 to 50 carbon atoms, a substituted or unsubstituted cycloalkyl of 3 to 30 carbon atoms, a substituted or unsubstituted heteroaryl of 2 to 50 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a substituted or unsubstituted arylamine of 5 to 30 carbon atoms, a substituted or unsubstituted alkylsilyl of 1 to 30 carbon atoms, a substituted or unsubstituted arylsilyl of 5 to 30 carbon atoms, a nitro, a cyano, and a halogen.

In Chemical Formula A, the linker Y may be an oxygen atom. Moreover, in Chemical Formula A, the central atom X may be a boron (B) atom.

In Chemical Formula A, the $Q_1$ to $Q_3$ ring moieties, which are bonded to the central atom X, may be the same or different and may each be independently a substituted or unsubstituted aromatic hydrocarbon ring of 6 to 50 carbon atoms.

In this regard, the aromatic hydrocarbon ring moieties $Q_1$ and $Q_2$ in Chemical Formula A may be the same or different and may each be independently any one selected from compounds represented by the following Structural Formulas 10 to 21:

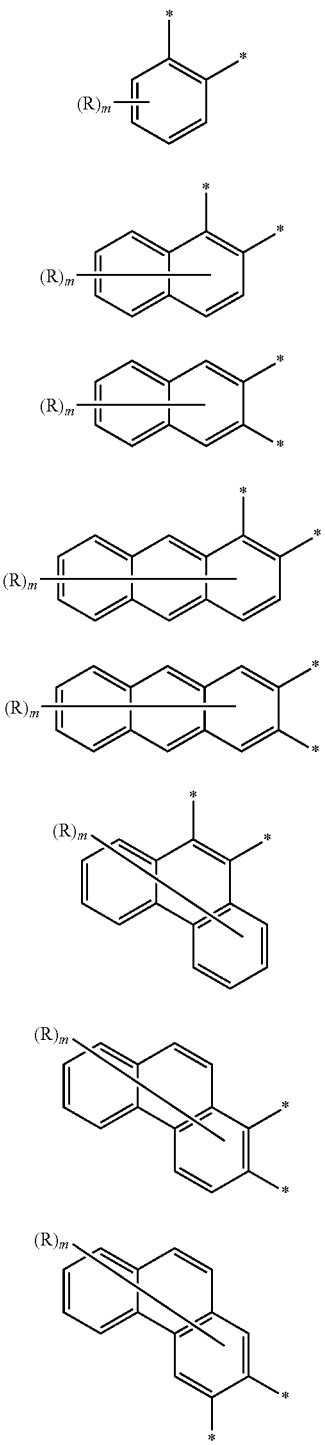

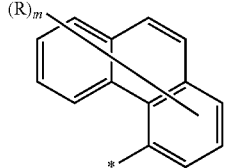

[Structural Formula 18]

[Structural Formula 19]

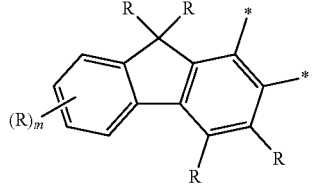

[Structural Formula 20]

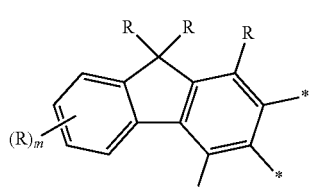

[Structural Formula 21]

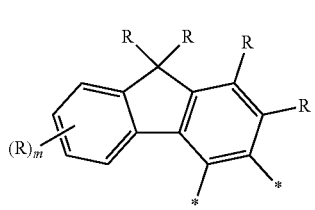

wherein, "-*" denotes a bonding site at which a carbon atom in the aromatic ring of $Q_1$ or $Q_2$ bonds to X, the linker Y, or a silicon atom (Si), R's, which may be the same or different, are each independently a hydrogen, a deuterium, a substituted or unsubstituted alkyl of 1 to 30 carbon atoms, a substituted or unsubstituted aryl of 6 to 50 carbon atoms, a substituted or unsubstituted cycloalkyl of 3 to 30 carbon atoms, a substituted or unsubstituted heteroaryl of 2 to 50 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a substituted or unsubstituted arylamine of 5 to 30 carbon atoms, a substituted or unsubstituted alkylsilyl of 1 to 30 carbon atoms, a substituted or unsubstituted arylsilyl of 5 to 30 carbon atoms, a cyano, and a halogen, and m is an integer of 1 to 8, wherein when m is two or more or two or more R's are present, the corresponding R's may be the same or different.

In the case where when the aromatic hydrocarbon rings of $Q_1$ to $Q_3$ are the same or different and are each independently a substituted or unsubstituted aromatic hydrocarbon ring of 6 to 50 carbon atoms, the aromatic hydrocarbon ring of $Q_3$ in Chemical Formula A may be a ring represented by the following Structural Formula B:

[Structural Formula B]

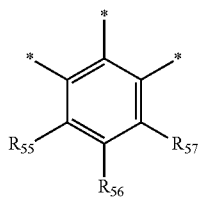

wherein "-*" denotes bonding sites at which the corresponding carbons in the aromatic ring of $Q_3$ bond to the linker Y and the silicon atom (Si) respectively, and $R_{55}$ to $R_{57}$, which may be the same or different, are each independently any one selected from a hydrogen, a deuterium, a substituted or unsubstituted alkyl of 1 to 30 carbon atoms, a substituted or unsubstituted aryl of 6 to 50 carbon atoms, a substituted or unsubstituted cycloalkyl of 3 to 30 carbon atoms, a substituted or unsubstituted heteroaryl of 2 to 50 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a substituted or unsubstituted arylamine of 5 to 30 carbon atoms, a substituted or unsubstituted alkylsilyl of 1 to 30 carbon atoms, a substituted or unsubstituted arylsilyl of 5 to 30 carbon atoms, a cyano, and a halogen, and any adjacent two of $R_{55}$ to $R_{57}$ may be linked to each to each other to form an additional mono- or polycyclic aliphatic or aromatic ring.

In an embodiment, the boron compound represented by Chemical Formula A may be any one selected from the following <Compound 1> to <Compound 87>:

<Compound 1>

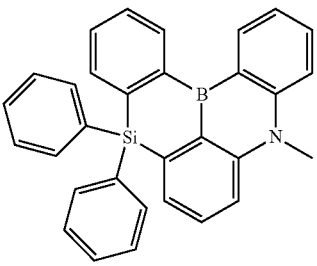

<Compound 2>

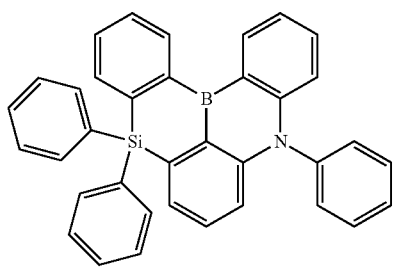

<Compound 3>

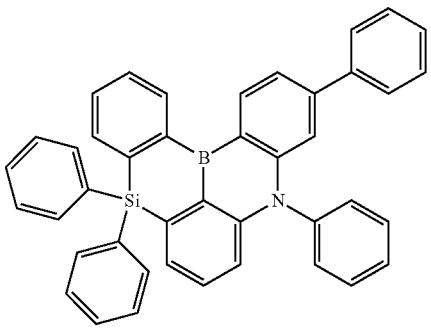

<Compound 4>

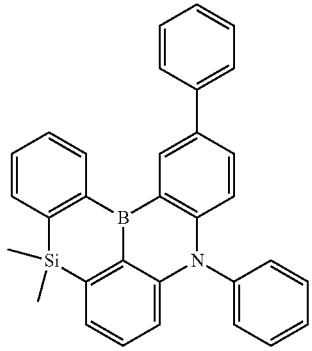

<Compound 5>

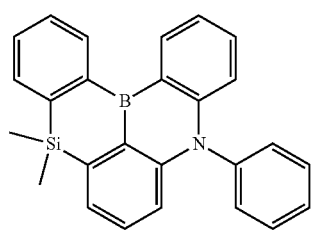

<Compound 6>

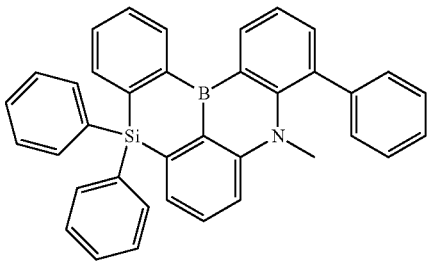

<Compound 7>

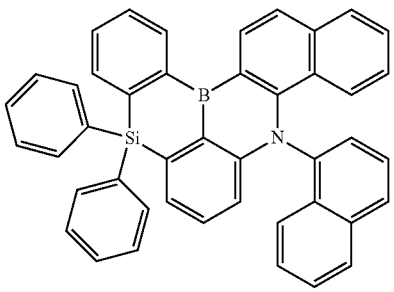

-continued
<Compound 8>
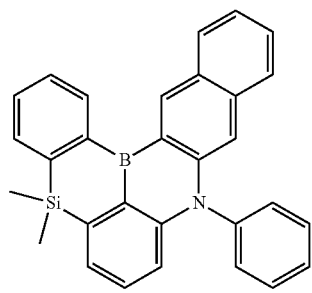
<Compound 9>
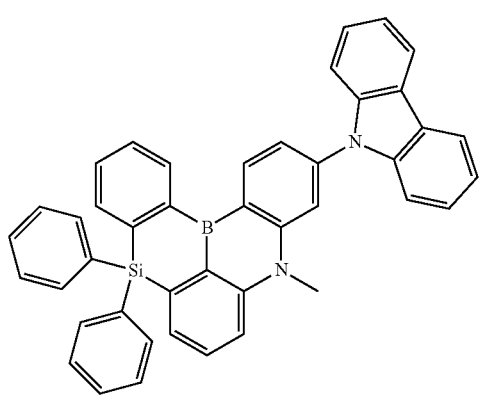
<Compound 10>
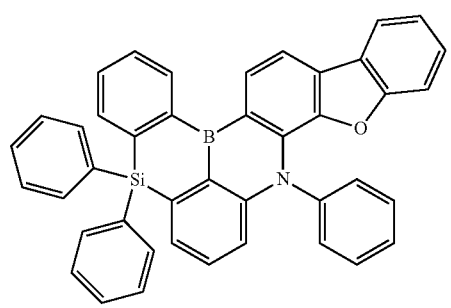
<Compound 11>
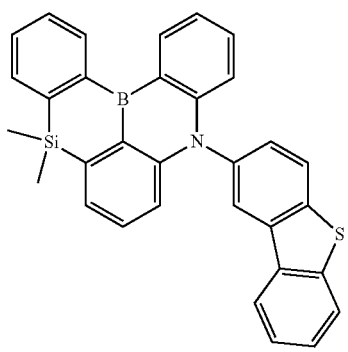
-continued
<Compound 12>
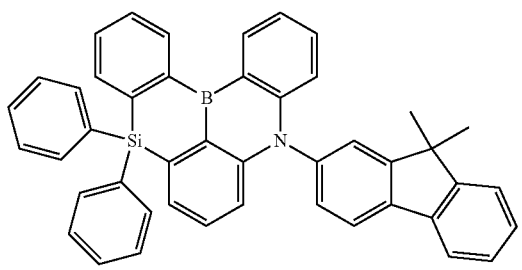
<Compound 13>
<Compound 14>
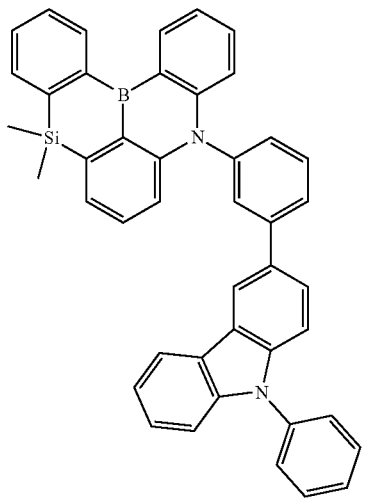

<Compound 15>
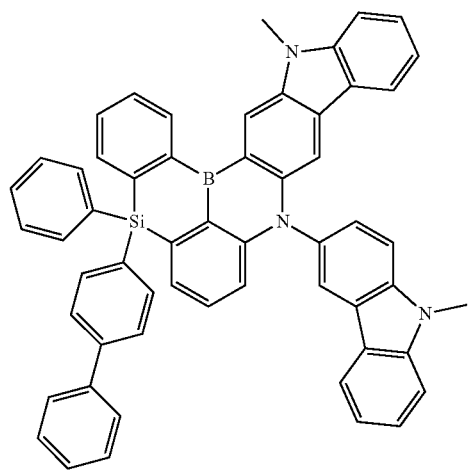
<Compound 16>
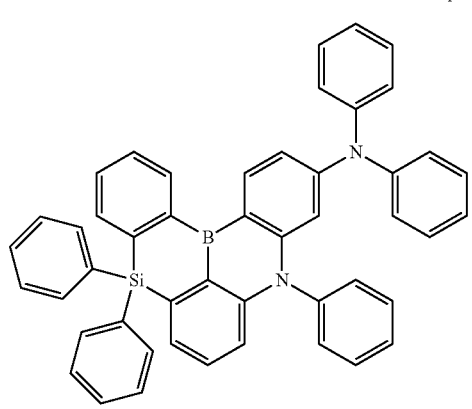
<Compound 17>
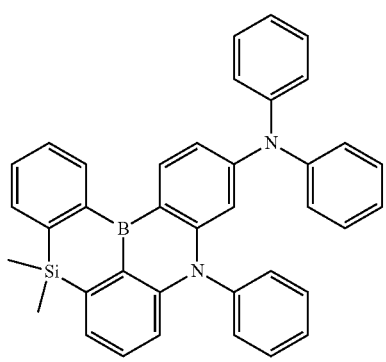
<Compound 18>
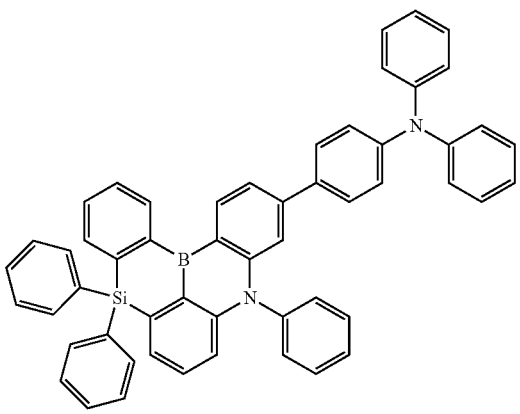
<Compound 19>
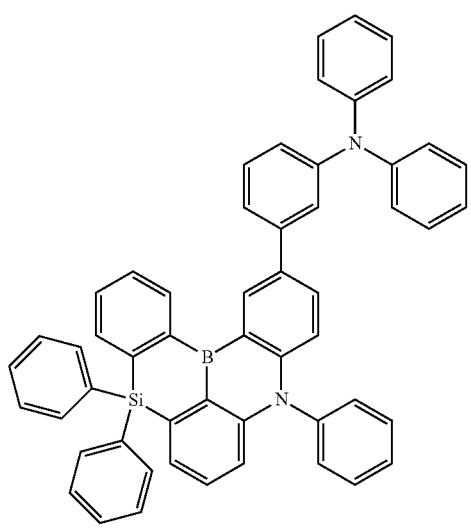
<Compound 20>

<Compound 21>
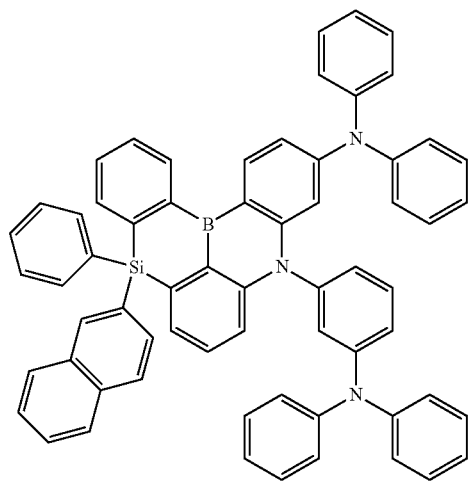
<Compound 22>
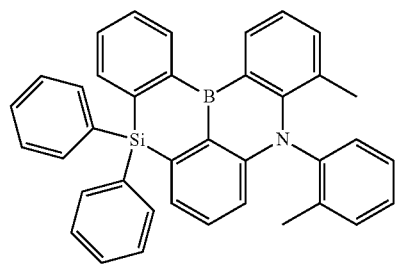
<Compound 23>
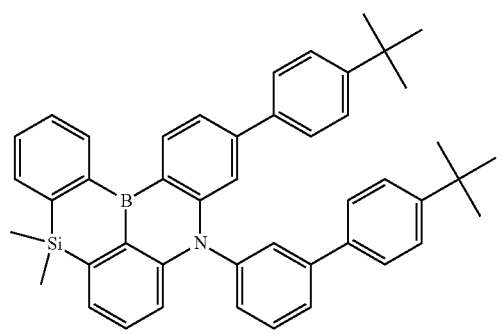
<Compound 24>
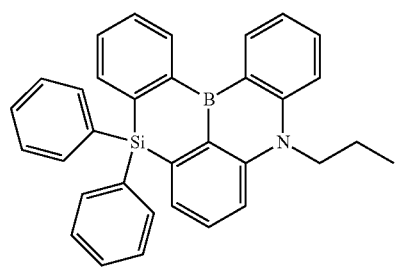
<Compound 25>
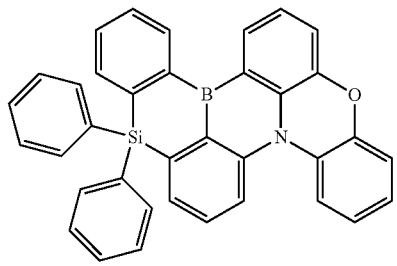
<Compound 26>
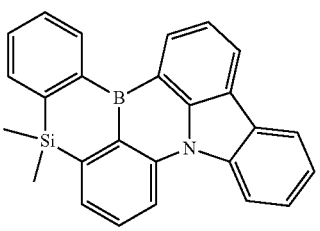
<Compound 27>
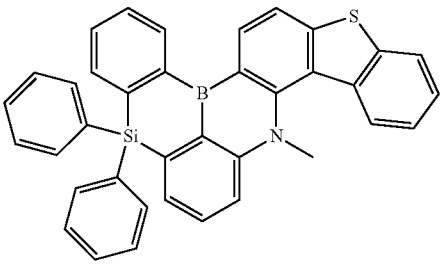
<Compound 28>
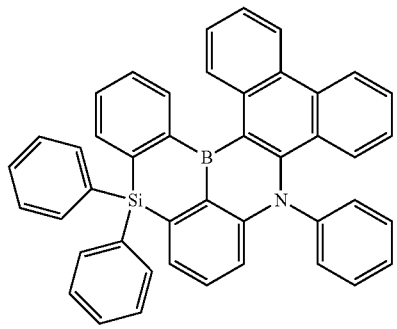
<Compound 29>
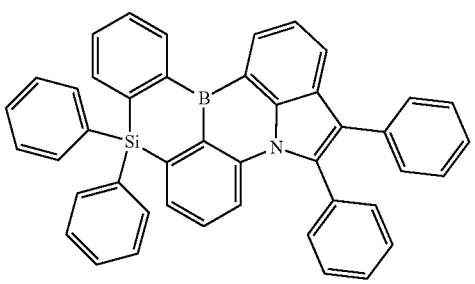

<Compound 30>
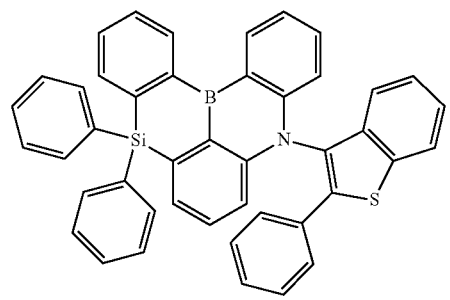
<Compound 31>
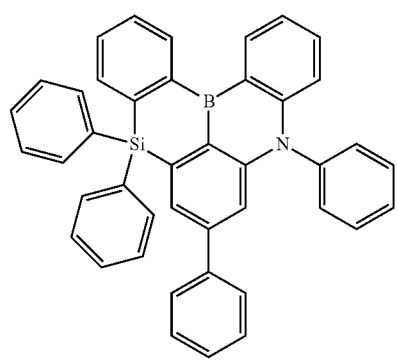
<Compound 32>
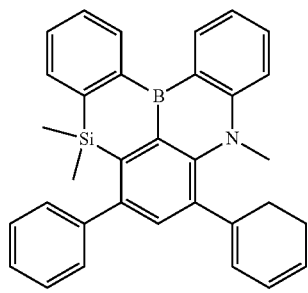
<Compound 33>
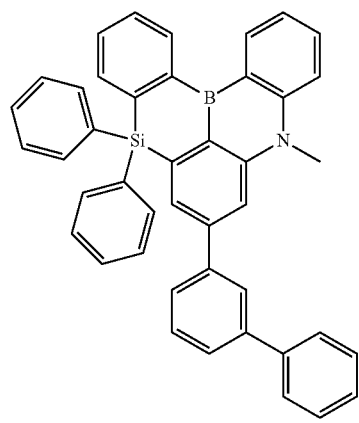
<Compound 34>
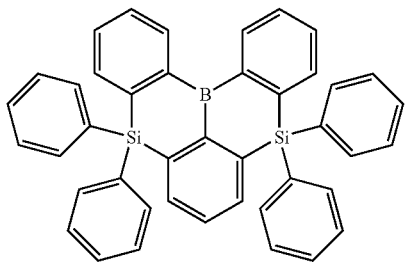
<Compound 35>
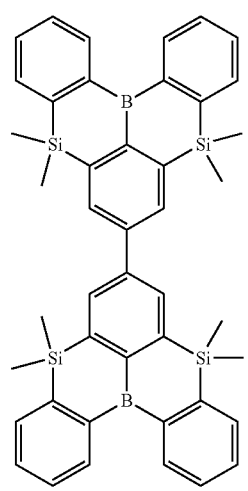
<Compound 36>
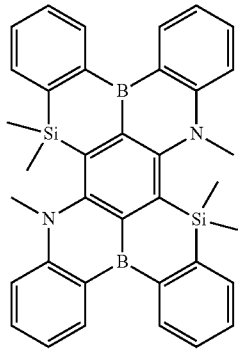
<Compound 37>
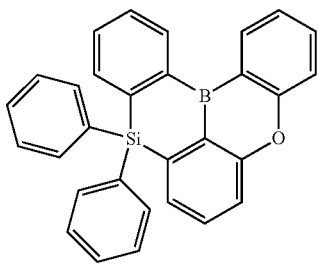
<Compound 38>
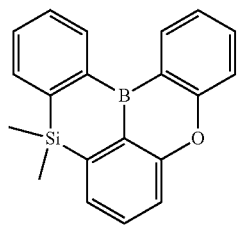

<Compound 39>
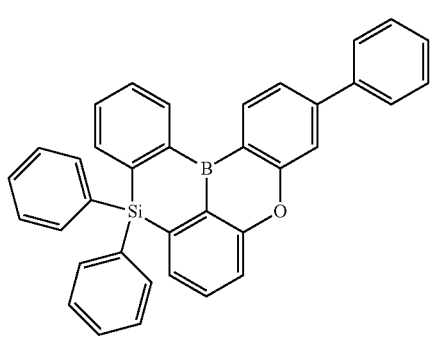
<Compound 40>
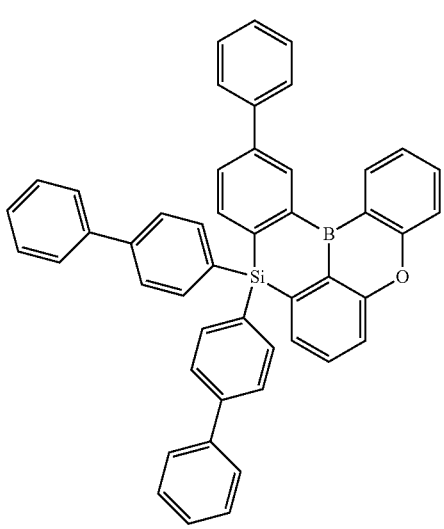
<Compound 41>
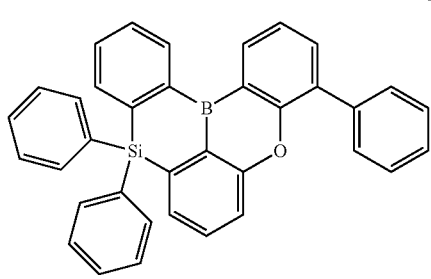
<Compound 42>
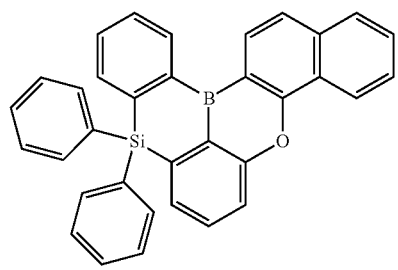
<Compound 43>
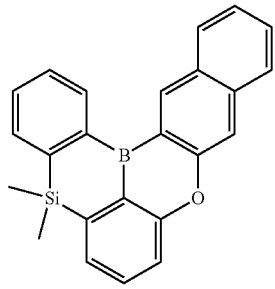
<Compound 44>
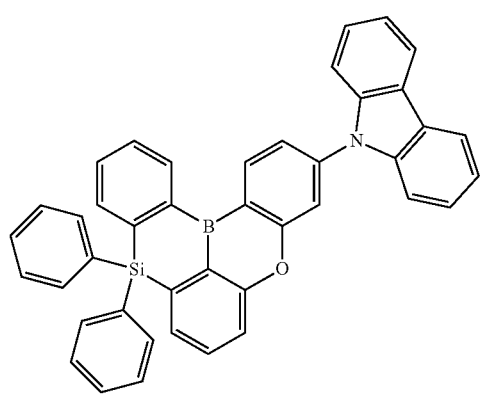
<Compound 45>
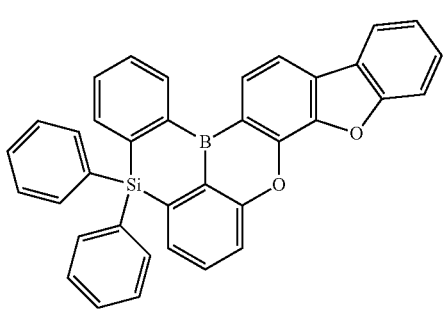
<Compound 46>
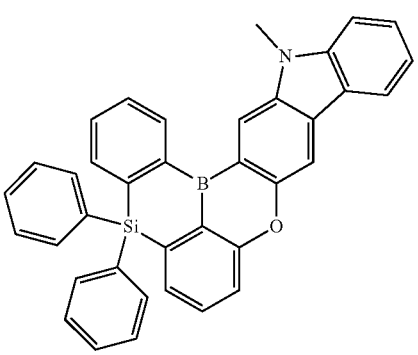
<Compound 47>
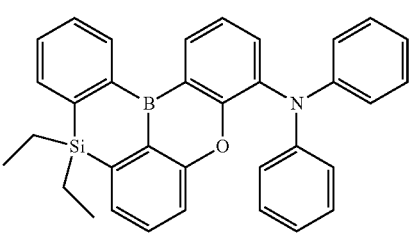

<Compound 48>
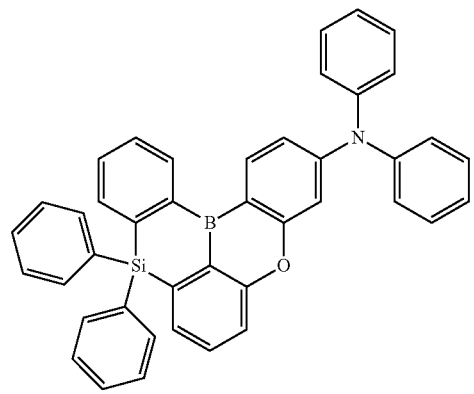
<Compound 49>
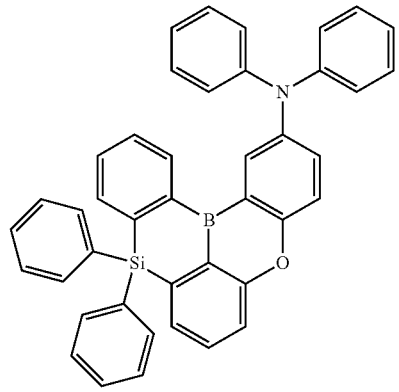
<Compound 50>
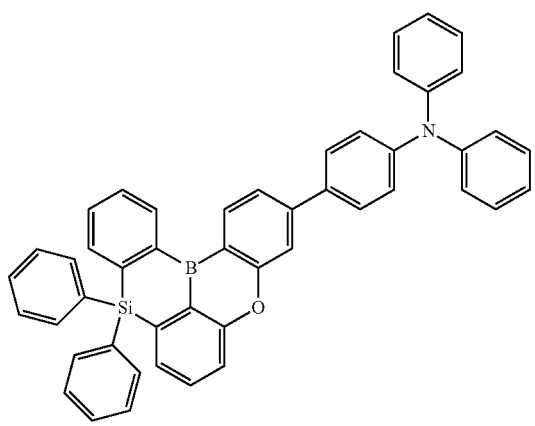
<Compound 51>
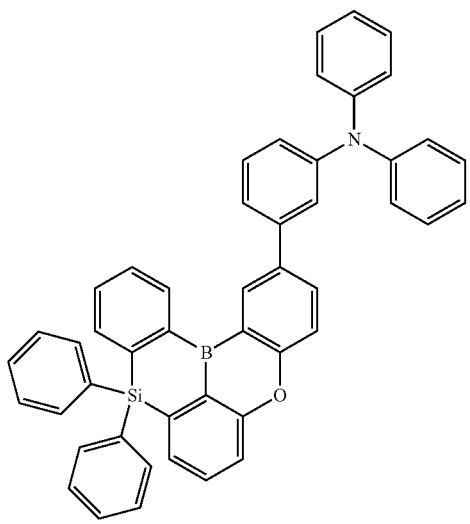
<Compound 52>
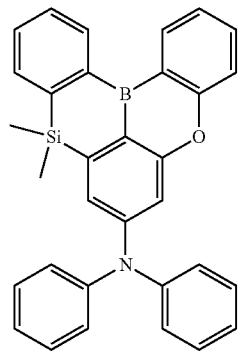
<Compound 53>
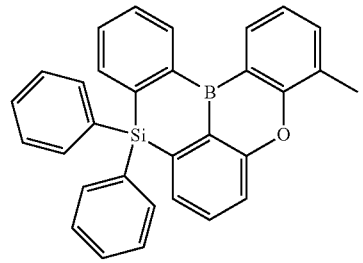
<Compound 54>
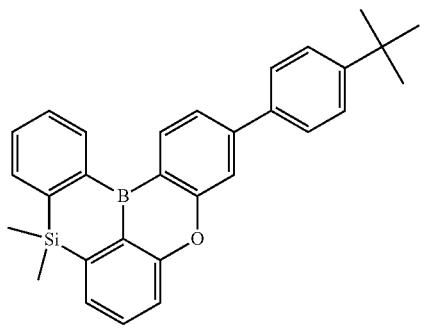

<Compound 55>
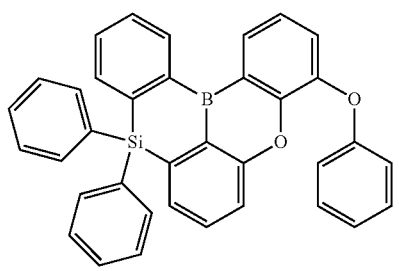
<Compound 56>
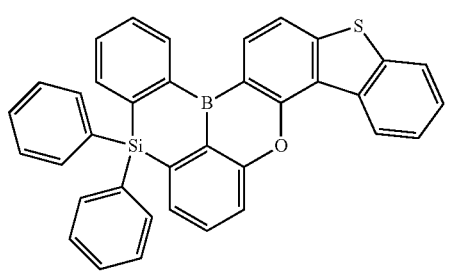
<Compound 57>
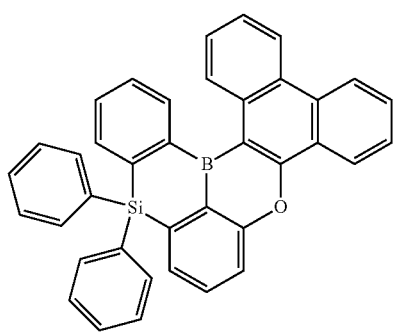
<Compound 58>
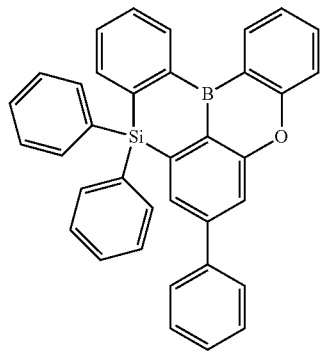
<Compound 59>
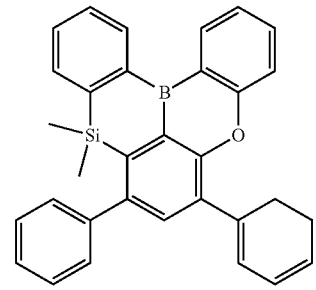
<Compound 60>
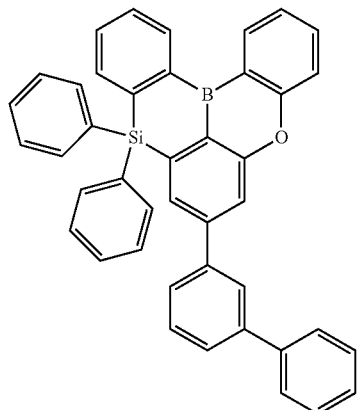
<Compound 61>
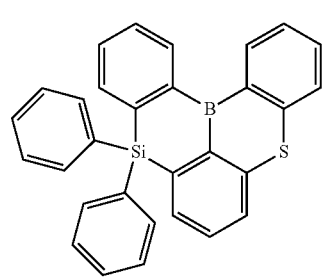
<Compound 62>
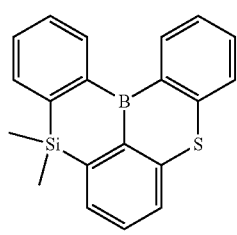
<Compound 63>
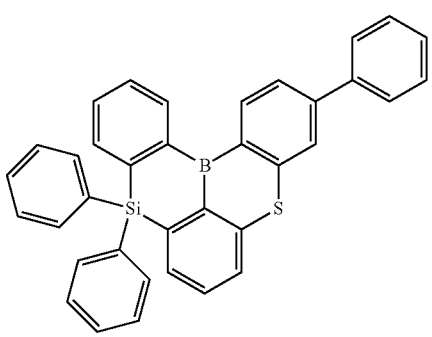
<Compound 64>
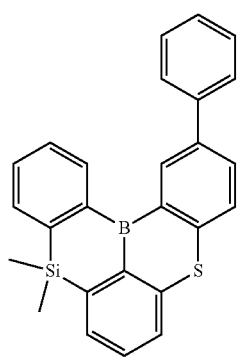

<Compound 65>
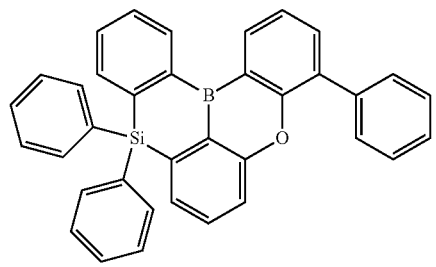
<Compound 66>
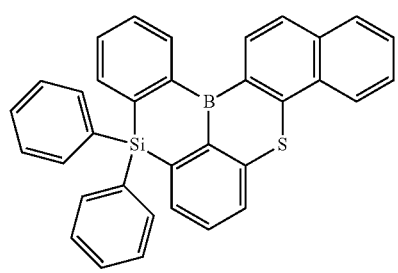
<Compound 67>
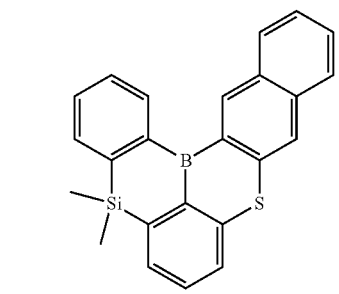
<Compound 68>
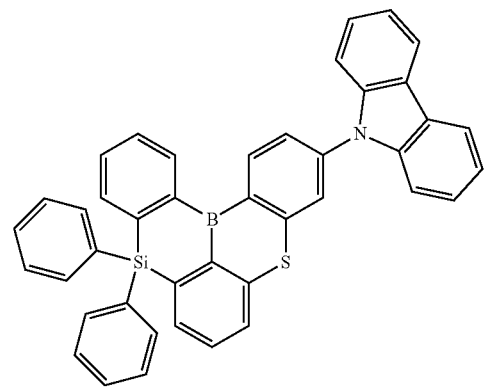
<Compound 69>
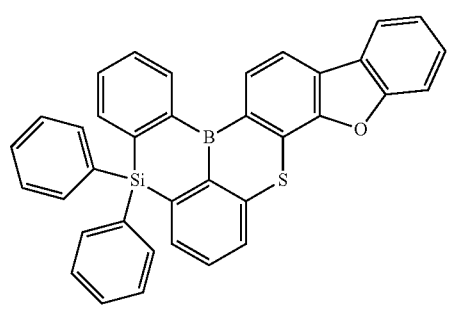
<Compound 70>
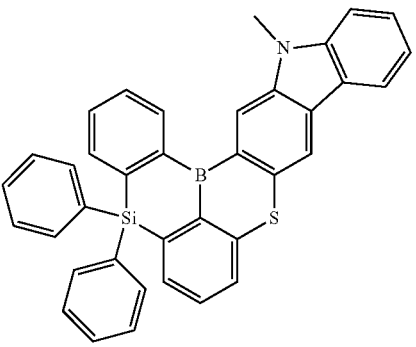
<Compound 71>
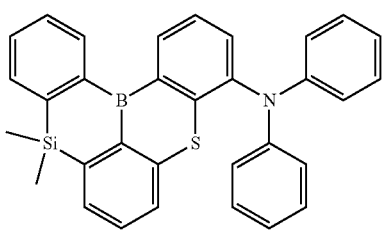
<Compound 72>
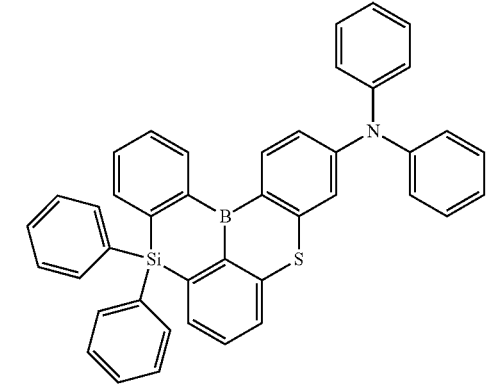
<Compound 73>
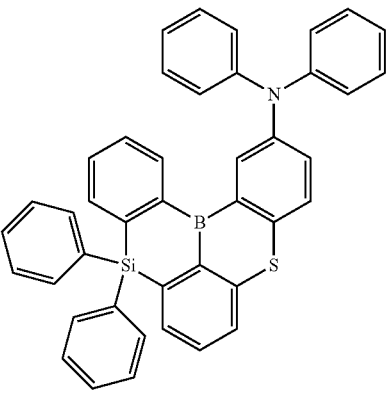

<Compound 74>
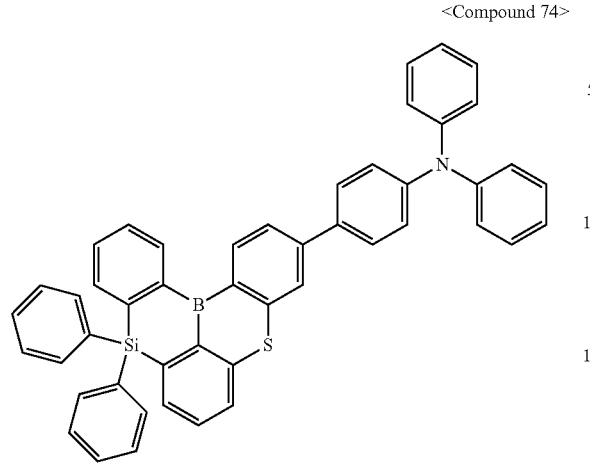
<Compound 75>
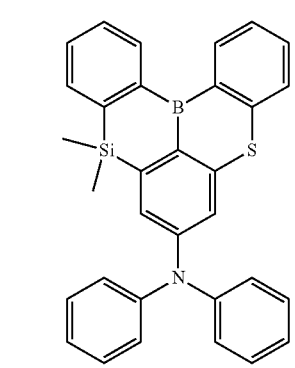
<Compound 76>
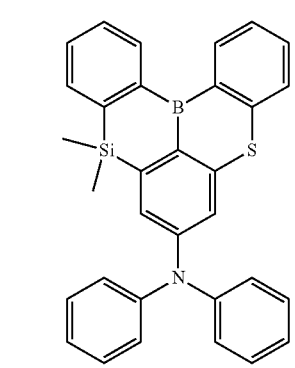
<Compound 77>
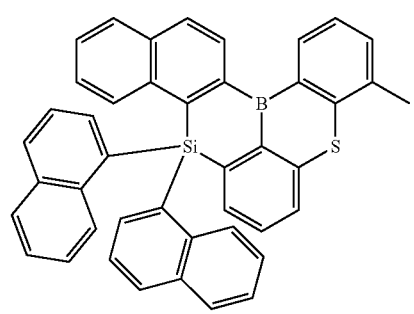
<Compound 78>
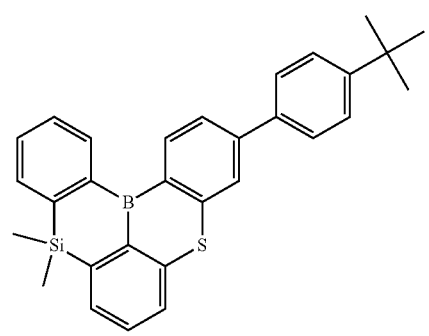
<Compound 79>
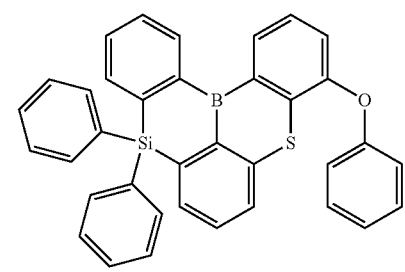
<Compound 80>
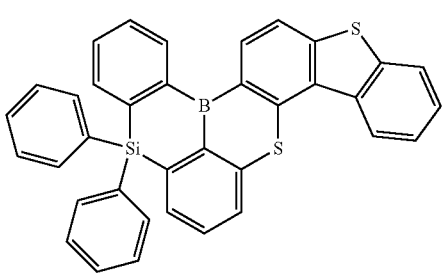
<Compound 81>
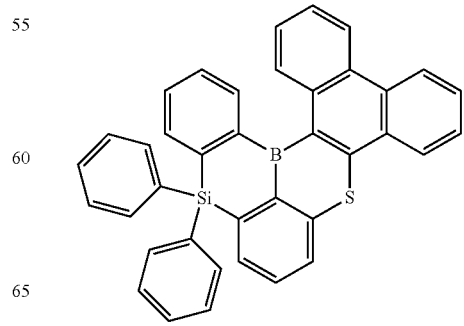

<Compound 82>
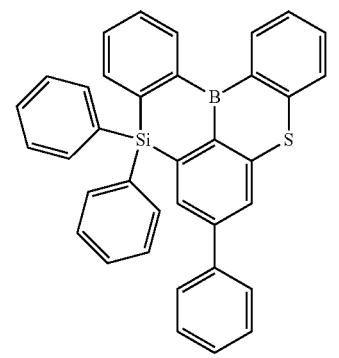

<Compound 83>
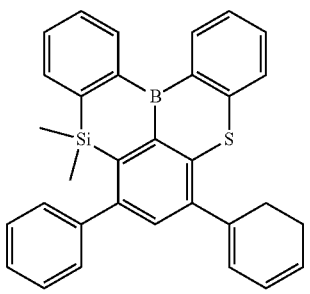

<Compound 84>
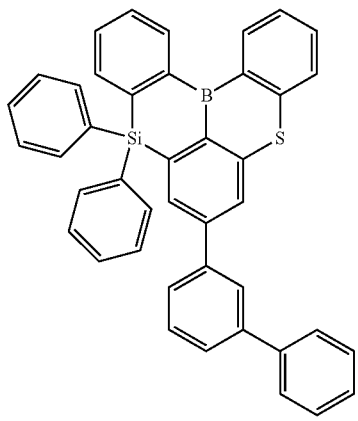

<Compound 85>
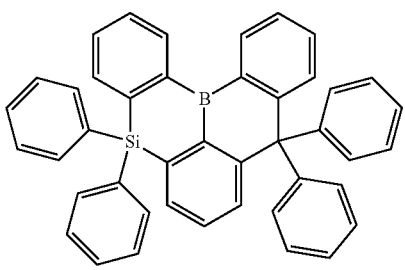

<Compound 86>
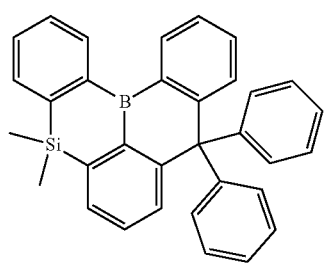

<Compound 87>
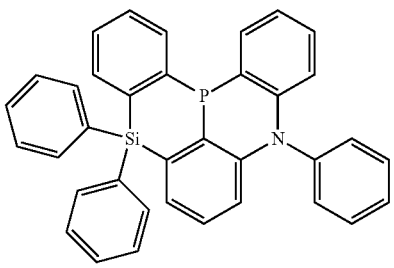

In particular some embodiments thereof, the present disclosure provides an organic light-emitting diode comprising: a first electrode; a second electrode facing the second electrode; and an organic layer interposed between the first electrode and the second electrode, wherein the organic layer includes a boron compound represented by Chemical Formula A.

Throughout the description of the present disclosure, the phrase "(an organic layer) includes at least one organic compound" may be construed to mean that "(an organic layer) may include a single organic compound species or two or more difference species of organic compounds falling within the scope of the present disclosure".

In this regard, the organic light-emitting diode according to the present disclosure may include at least one of a hole injection layer, a hole transport layer, a functional layer capable of both hole injection and hole transport, a light-emitting layer, an electron transport layer, an electron injection layer, and a capping layer.

In more particular embodiments of the present disclosure, the organic layer disposed between the first electrode and the second electrode includes a light-emitting layer composed of a host and a dopant, wherein the boron compound represented by Chemical Formula A serves as the dopant.

In an embodiment, an anthracene derivative represented by the following Chemical Formula C may be used as a host in the organic light-emitting diode according to the present invention:

[Chemical Formula C]

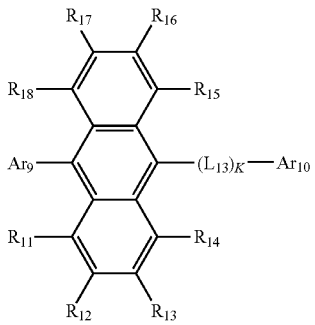

wherein, $R_{11}$ to $R_{18}$, which are the same or different, are each as defined for $R_1$ to $R_5$ in the boron compound above;

$Ar_9$ and $Ar_{10}$, which are the same or different, are each independently any one selected from a hydrogen atom, a deuterium atom, a substituted or unsubstituted alkyl of 1 to 30 carbon atoms, a substituted or unsubstituted aryl of 6 to 50 carbon atoms, a substituted or unsubstituted alkenyl of 2 to 30 carbon atoms, a substituted or unsubstituted alkynyl 2 to 20 carbon atoms, a substituted or unsubstituted cycloalkyl of 3 to 30 carbon atoms, a substituted or unsubstituted cycloalkenyl 5 to 30 carbon atoms, a substituted or unsubstituted heteroaryl of 2 to 50 carbon atoms, a substituted or unsubstituted heterocycloalkyl of 2 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 6 to 30 carbon atoms, a substituted or unsubstituted alkylamine of 1 to 30 carbon atoms, a substituted or unsubstituted aryamine of 6 to 30 carbon atoms, a substituted or unsubstituted alkylsilyl of 1 to 30 carbon atoms, and a substituted or unsubstituted arylsilyl of 6 to 30 carbon atoms;

$L_{13}$, which functions as a linker, is a single bond or is selected from a substituted or unsubstituted arylene of 6 to 20 carbon atoms, and a substituted or unsubstituted heteroarylene of 2 to 20 carbon atoms; and k is an integer of 1 to 3, wherein when k is 2 or greater, the corresponding $L_{13}$'s are the same or different.

In this case, $L_{13}$ may be a single bond or a substituted or unsubstituted arylene of 6 to 20 carbon atoms, and k may be 1 or 2, with the proviso that when k is 2, corresponding $L_{13}$'s may be the same or different.

For a more exemplary host, $Ar_9$ in Chemical Formula C may be a substituent represented by the following Chemical Formula C-1:

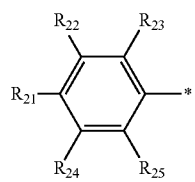

[Chemical Formula C-1]

wherein, $R_{21}$ to $R_{25}$, which may be the same or different, are as defined for $R_1$ to $R_5$, above; and may each be linked to an adjacent one to form a saturated or unsaturated cyclic ring.

According to one embodiment, the anthracene derivative may be any one selected from the compounds represented by the following <Chemical Formula C1> to <Chemical Formula C48>:

<Chemical Formula C1>

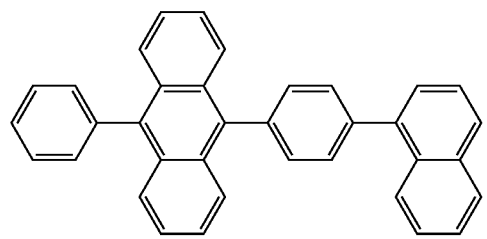

<Chemical Formula C2>

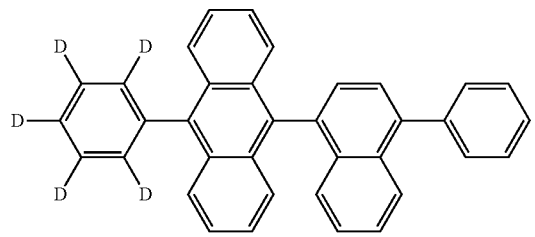

<Chemical Formula C3>

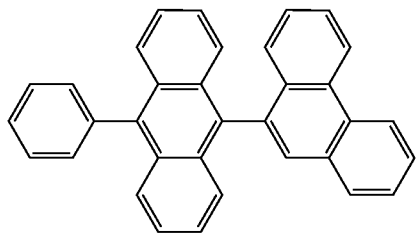

<Chemical Formula C4>

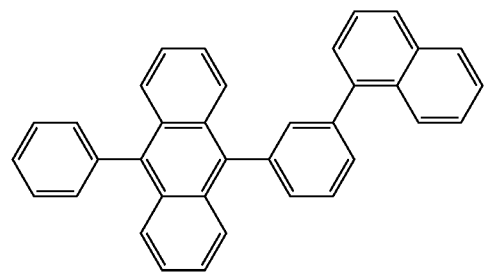

<Chemical Formula C5>

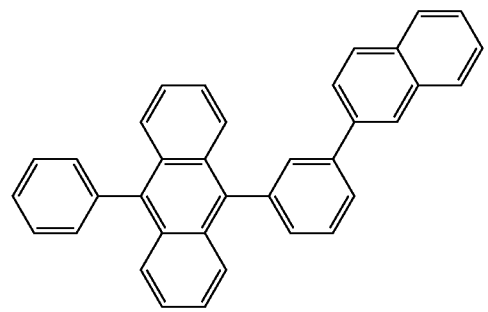

<Chemical Formula C6>

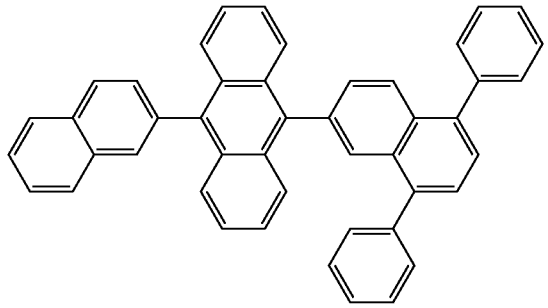

-continued
<Chemical Formula C7>
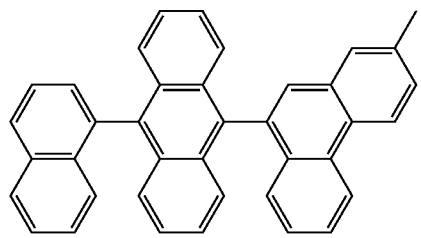
<Chemical Formula C8>
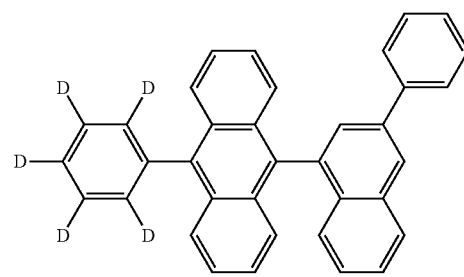
<Chemical Formula C9>
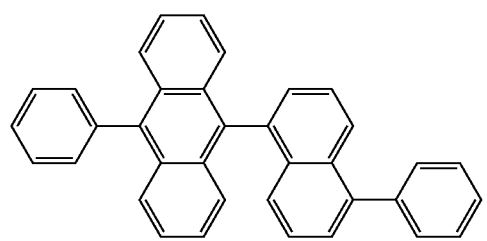
<Chemical Formula C10>
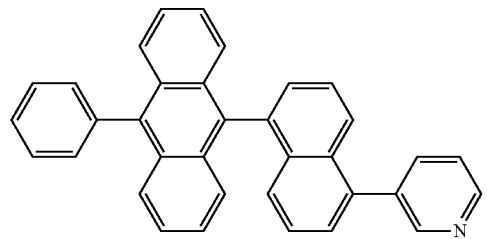
<Chemical Formula C11>
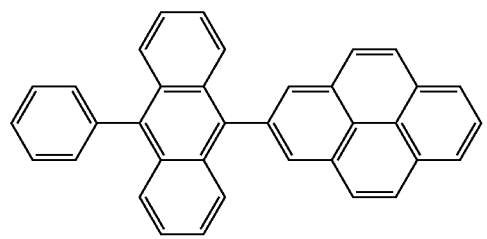
<Chemical Formula C12>
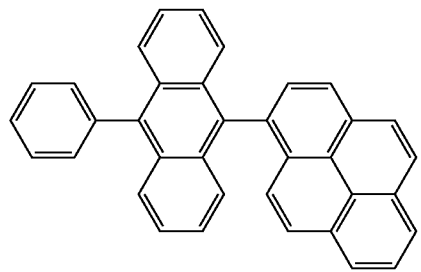
-continued
<Chemical Formula C13>
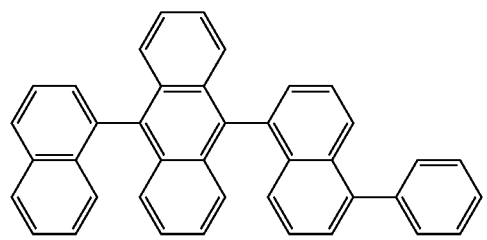
<Chemical Formula C14>
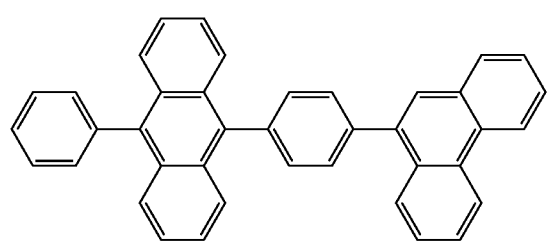
<Chemical Formula C15>
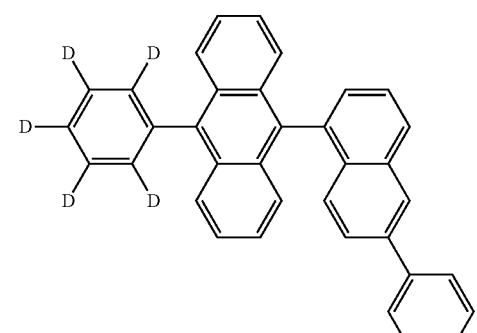
<Chemical Formula C16>
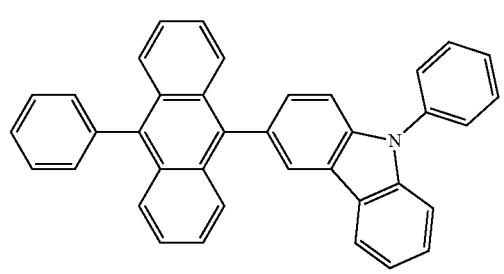
<Chemical Formula C17>
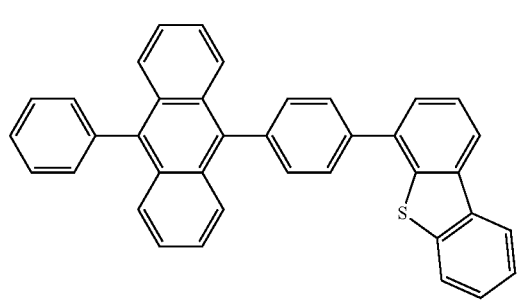

<Chemical Formula C18>
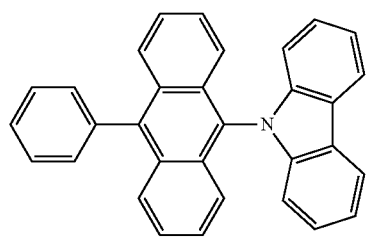
<Chemical Formula C19>
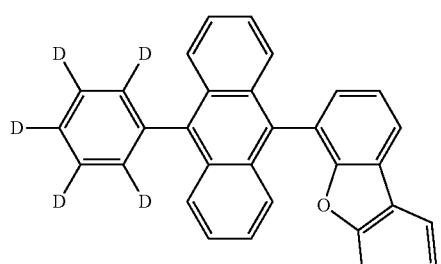
<Chemical Formula C20>
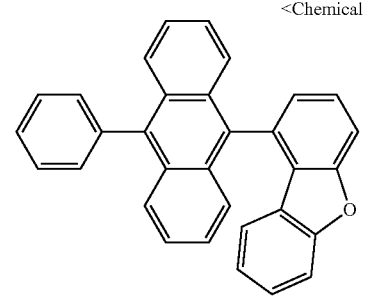
<Chemical Formula C21>
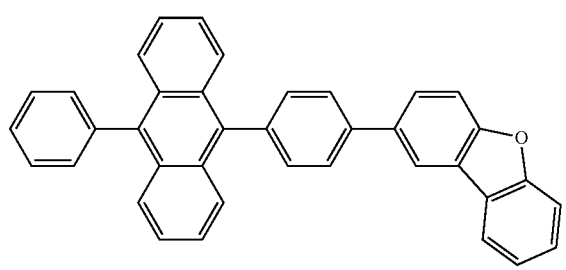
<Chemical Formula C22>
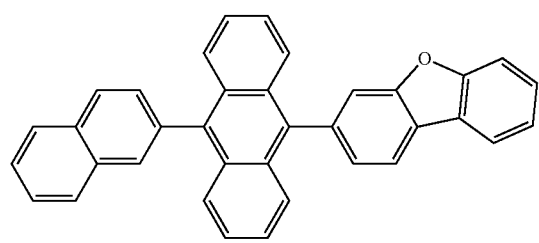
<Chemical Formula C23>
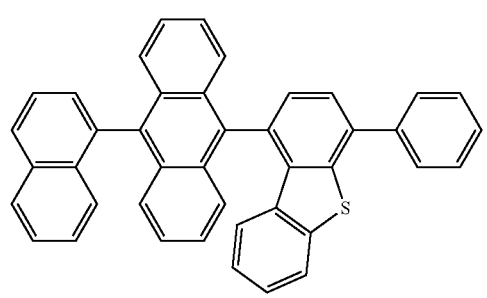
<Chemical Formula C24>
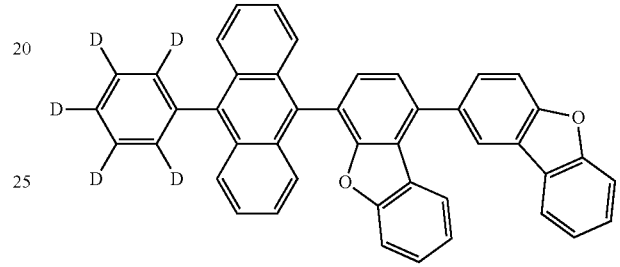
<Chemical Formula C25>
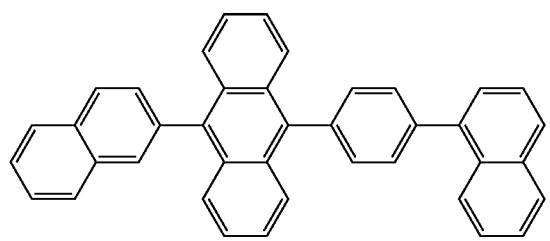
<Chemical Formula C26>
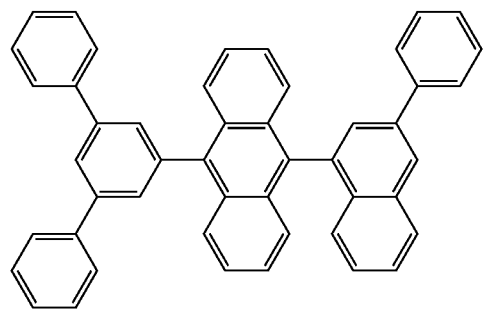
<Chemical Formula C27>
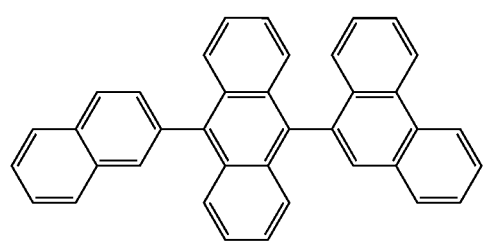

<Chemical Formula C28>
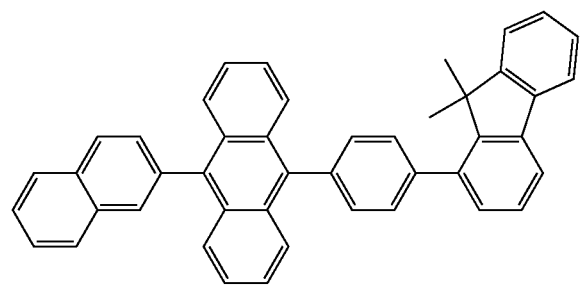
<Chemical Formula C29>
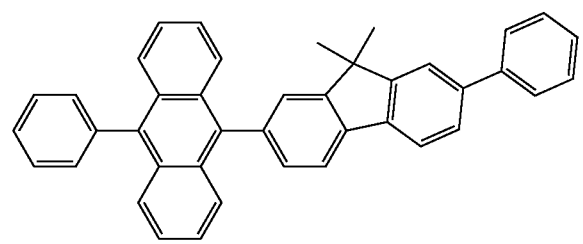
<Chemical Formula C30>
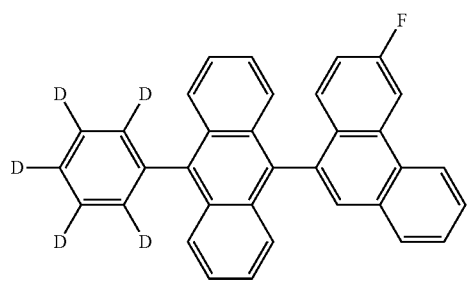
<Chemical Formula C31>
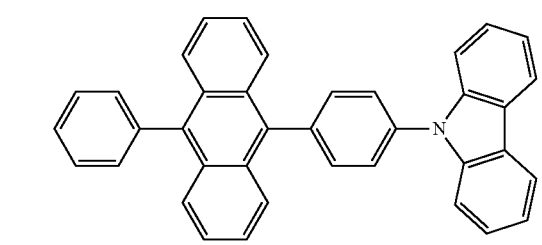
<Chemical Formula C32>
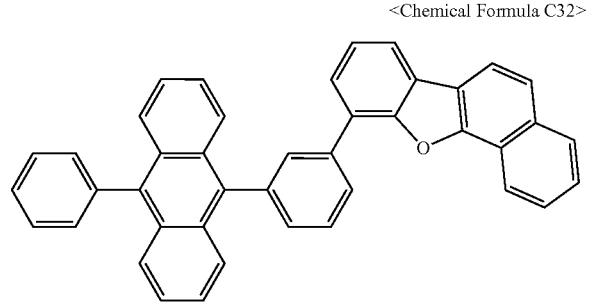
<Chemical Formula C33>
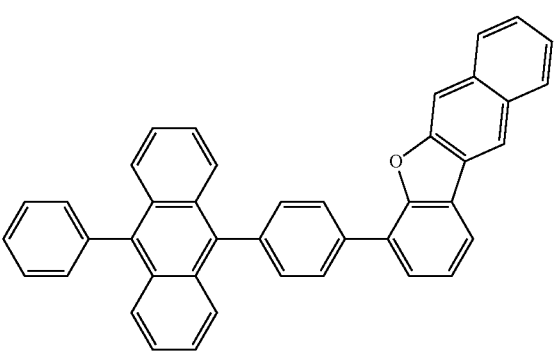
<Chemical Formula C34>
<Chemical Formula C35>
<Chemical Formula C36>
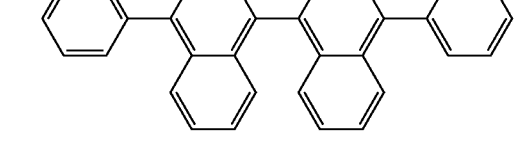
<Chemical Formula C37>
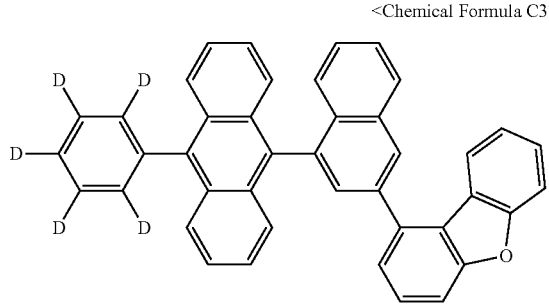

<Chemical Formula 38>
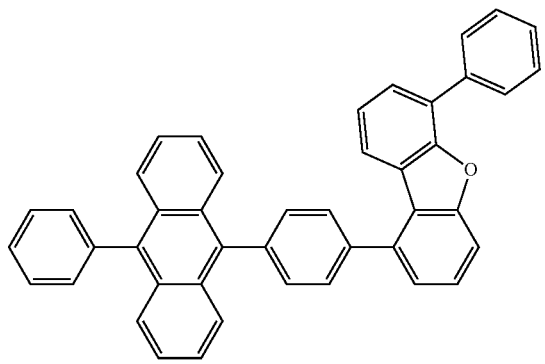
<Chemical Formula C42>
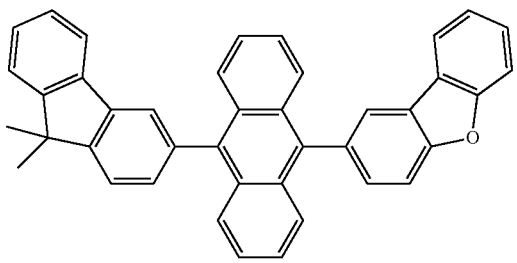
<Chemical Formula 39>
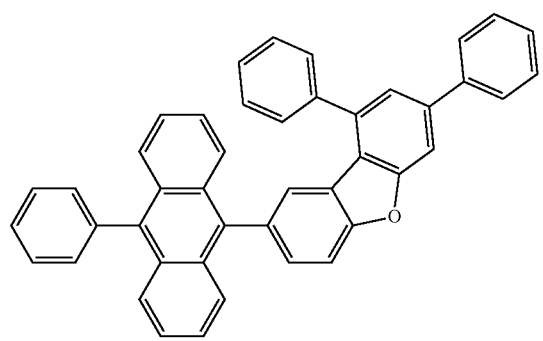
<Chemical Formula C43>
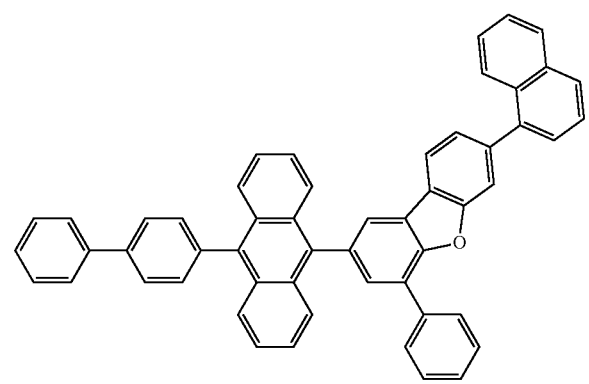
<Chemical Formula 40>
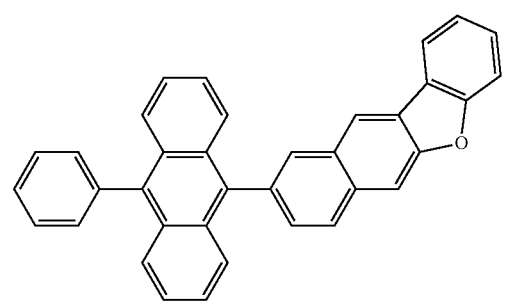
<Chemical Formula C44>
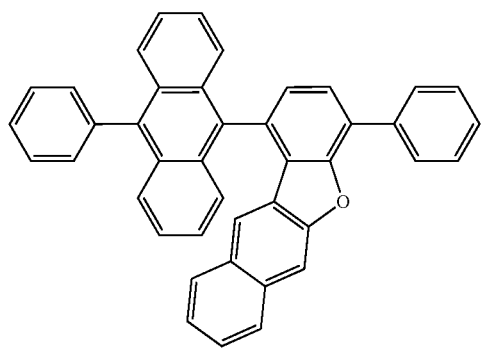
<Chemical Formula 41>
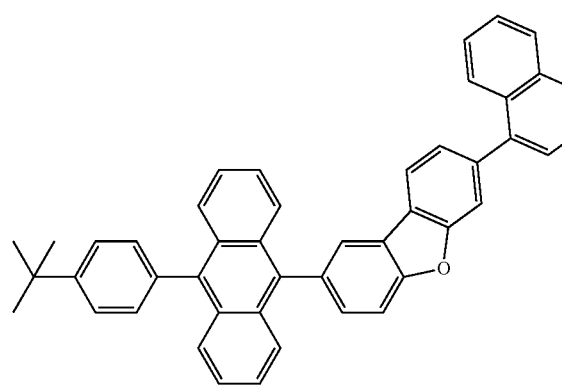
<Chemical Formula C45>
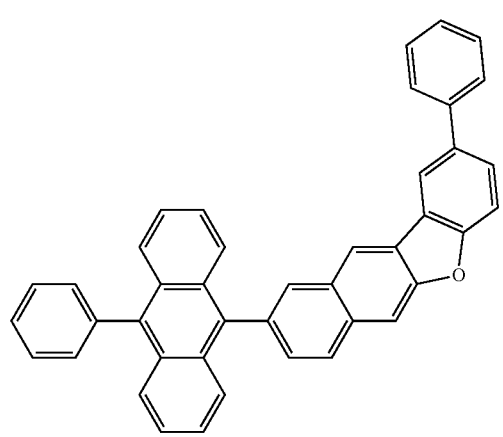

<Chemical Formula C46>

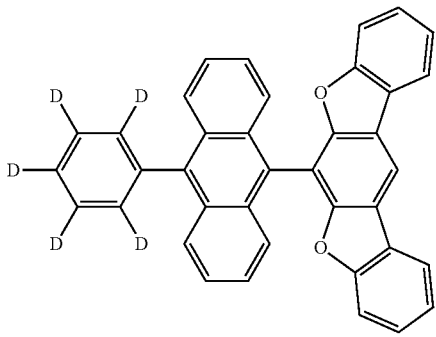

<Chemical Formula C47>

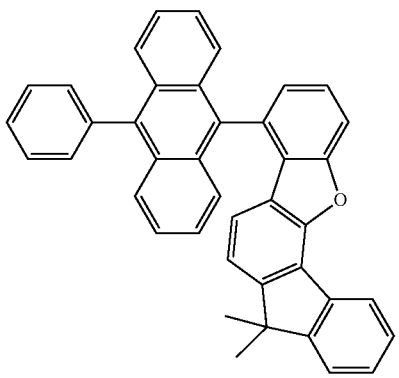

<Chemical Formula C48>

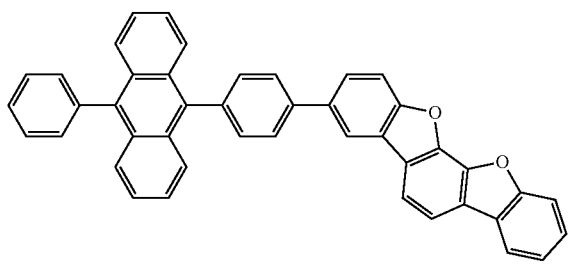

In a particular embodiment thereof, the present invention provides an organic light-emitting diode comprises: an anode as a first electrode; a cathode as a second electrode facing the first electrode; and an organic layer interposed between the anode and the cathode, wherein the organic layer comprises at least one of the boron compounds represented by Chemical Formula A as a dopant and at least one of the compounds represented by Chemical Formula C. Having such structural characteristics, the organic light-emitting diode according to the present disclosure can be driven at a low voltage with high luminous efficiency.

The content of the dopant in the light-emitting layer may range from about 0.01 to 20 parts by weight, based on 100 parts by weight of the host, but is not limited thereto.

Reference is made to FIG. 1 with regard to the organic light emitting diode of the present disclosure and the fabrication thereof.

First, a substrate 10 is coated with an anode electrode material to form an anode 20. So long as it is used in a typical organic electroluminescence device, any substrate may be used as the substrate 10. Preferable is an organic substrate or transparent plastic substrate that exhibits excellent transparency, surface smoothness, ease of handling, and waterproofness. As the anode electrode material, indium tin oxide (ITO), indium zinc oxide (IZO), tin oxide ($SnO_2$), or zinc oxide (ZnO), which are transparent and superior in terms of conductivity, may be used.

A hole injection layer material is applied on the anode 20 by thermal deposition in a vacuum or by spin coating to form a hole injection layer 30. Subsequently, thermal deposition in a vacuum or by spin coating may also be conducted to form a hole transport layer 40 with a hole transport layer material on the hole injection layer 30.

So long as it is typically used in the art, any material may be selected for the hole injection layer without particular limitations thereto. Examples include, but are not limited to, 2-TNATA [4,4',4"-tris(2-naphthylphenyl-phenylamino)-triphenylamine], NPD [N,N'-di(1-naphthyl)-N,N'-diphenyl-benzidine)], TPD [N,N'-diphenyl-N,N'-bis(3-methylphenyl)-1,1'-biphenyl-4,4'-diamine], and DNTPD [N,N'-diphenyl-N,N'-bis-[4-(phenyl-m-tolyl-amino)-phenyl]-biphenyl-4,4'-diamine].

Any material that is typically used in the art may be selected for the hole transport layer without particular limitations thereto. Examples include, but are not limited to, N,N'-bis(3-methylphenyl)-N,N'-diphenyl-[1,1-biphenyl]-4,4'-diamine (TPD) and N,N'-di(naphthalen-1-yl)-N,N'-diphenylbenzidine (a-NPD).

In an embodiment of the present disclosure, an electron blocking layer may be additionally disposed on the hole transport layer. Functioning to prevent the electrons injected from the electron injection layer from entering the hole transport layer from the light-emitting layer, the electron blocking layer is adapted to increase the life span and luminous efficiency of the diode. The electron blocking layer may be formed a material known in the art, or a combination thereof at a suitable position between the light emitting layer and the hole injection layer. Particularly, the electron blocking layer may be formed between the light emitting layer and the hole transport layer.

Next, the light-emitting layer 50 may be deposited on the hole transport layer 40 or the electron blocking layer by deposition in a vacuum or by spin coating.

Herein, the light-emitting layer may contain a host and a dopant and the materials are as described above.

In some embodiments of the present disclosure, the light-emitting layer particularly ranges in thickness from 50 to 2,000 Å.

Meanwhile, the electron transport layer 60 is applied on the light-emitting layer by deposition in a vacuum and spin coating.

A material for use in the electron transport layer functions to stably carry the electrons injected from the electron injection electrode (cathode), and may be an electron transport material known in the art. Examples of the electron transport material known in the art include quinoline derivatives, particularly, tris(8-quinolinolate)aluminum (Alq3), Liq, TAZ, BAlq, beryllium bis(benzoquinolin-10-olate) (Bebq2), Compound 201, Compound 202, BCP, and oxadiazole derivatives such as PBD, BMD, and BND, but are not limited thereto:

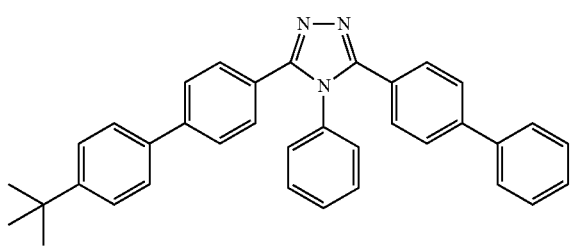

TAZ

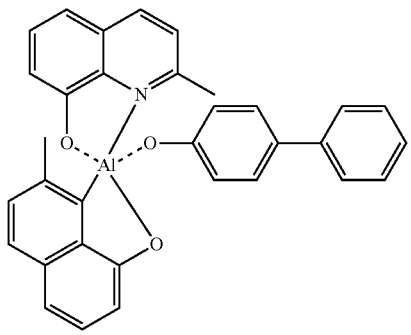

Balq

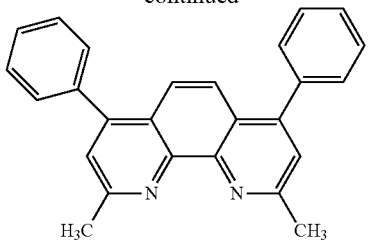

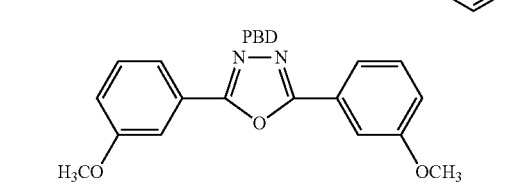

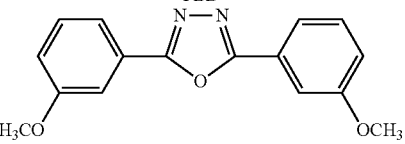

<Compound 201>

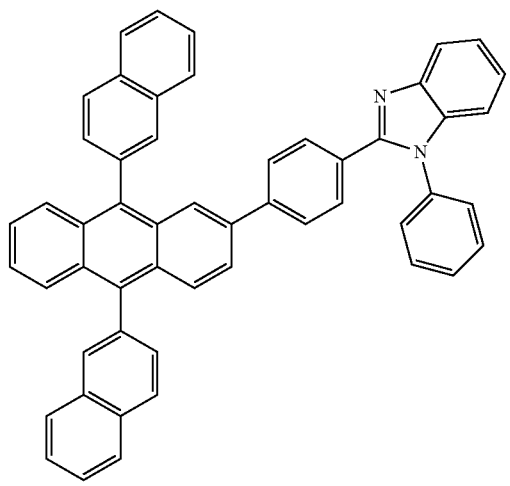

<Compound 202>

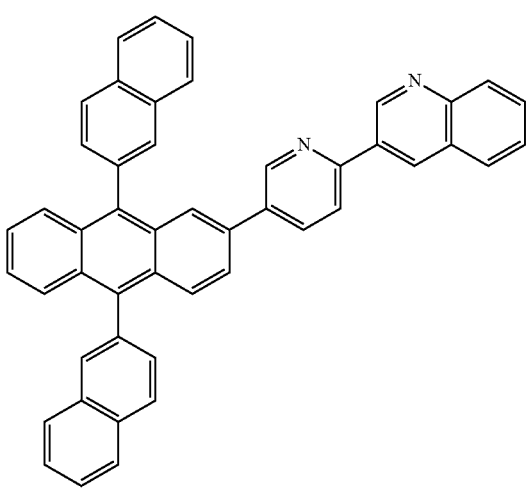

In the organic light emitting diode of the present disclosure, an electron injection layer (EIL) that functions to facilitate electron injection from the cathode may be deposited on the electron transport layer. The material for the EIL is not particularly limited.

Any material that is conventionally used in the art can be available for the electron injection layer without particular limitations. Examples include CsF, NaF, LiF, $Li_2O$, and BaO. Deposition conditions for the electron injection layer may vary, depending on compounds used, but may be generally selected from condition scopes that are almost the same as for the formation of hole injection layers.

The electron injection layer may range in thickness from about 1 Å to about 100 Å, and particularly from about 3 Å to about 90 Å. Given the thickness range for the electron injection layer, the diode can exhibit satisfactory electron injection properties without actually elevating a driving voltage.

In order to facilitate electron injection, the cathode may be made of a material having a small work function, such as metal or metal alloy such as lithium (Li), magnesium (Mg), calcium (Ca), an alloy aluminum (Al) thereof, aluminum-lithium (Al—Li), magnesium-indium (Mg—In), and magnesium-silver (Mg—Ag). Alternatively, ITO or IZO may be employed to form a transparent cathode for an organic light-emitting diode.

Moreover, the organic light-emitting diode of the present disclosure may further comprise a light-emitting layer containing a blue, green, or red luminescent material that emits radiations in the wavelength range of 380 nm to 800 nm. That is, the light-emitting layer in the present disclosure has a multi-layer structure wherein the blue, green, or red luminescent material may be a fluorescent material or a phosphorescent material.

Furthermore, at least one selected from among the layers may be deposited using a single-molecule deposition process or a solution process.

Here, the deposition process is a process by which a material is vaporized in a vacuum or at a low pressure and deposited to form a layer, and the solution process is a method in which a material is dissolved in a solvent and applied for the formation of a thin film by means of inkjet printing, roll-to-roll coating, screen printing, spray coating, dip coating, spin coating, etc.

Also, the organic light-emitting diode of the present disclosure may be applied to a device selected from among flat display devices, flexible display devices, monochrome or grayscale flat illumination devices, and monochrome or grayscale flexible illumination devices.

A better understanding of the present disclosure may be obtained through the following examples which are set forth to illustrate, but are not to be construed as limiting the present invention.

EXAMPLES

Synthesis Example 1

Synthesis Example 1-1: Synthesis of [Intermediate 1-a]

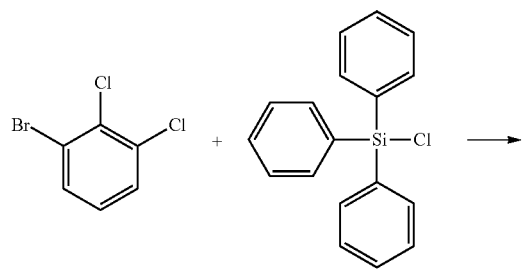

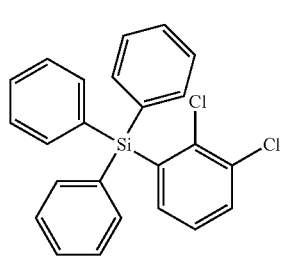

[Intermediate 1-a]

In a round-bottom flask, a mixture of 1-bromo-2,3-dichlorobenzene (50 g, 221 mmol) and tetrahydrofuran (500 ml) was chilled to −78° C. Drops of 1.6 M n-butyl lithium (152 mL, 243 mmol) was slowly added to the mixture which was then stirred for 1 hour. At −78° C., triphenylsilyl chloride (65.3 g, 221 mmol) was dropwise added slowly, followed by stirring at room temperature. After completion of the reaction, the organic layer was concentrated in a vacuum and isolated by column chromatography to afford [Intermediate 1-a]. (24.2 g, yield 27%)

Synthesis Example 1-2: Synthesis of [Intermediate 1-b]

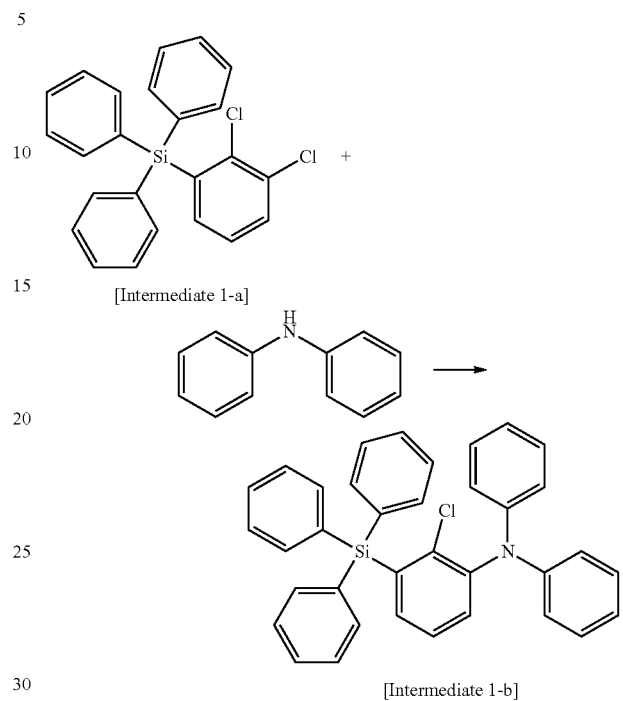

[Intermediate 1-b]

In a round-bottom flask, [Intermediate 1-a] (20 g, 49 mmol), diphenylamine (8.3 g, 49 mmol), trisdibenzylidene acetone dipalladium (0.9 g, 1.0 mmol), tri-tert-butyl phosphine (0.4 g, 2 mmol), sodium tert-butoxide (7.1 g, 74 mmol), and toluene (200 ml) were fluxed for 6 hours under a nitrogen atmosphere. After completion of the reaction, the organic layer was concentrated and isolated by column chromatography to afford [Intermediate 1-b]. (17.5 g, yield 66%)

Synthesis Example 1-3. Synthesis of [Compound 1]

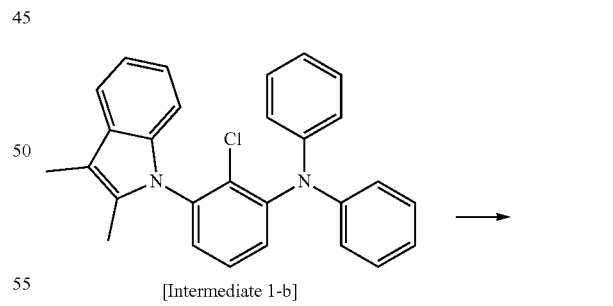

[Intermediate 1-b]

[Compound 1]

In a round-bottom flask, tert-butyl benzene (200 ml) was added with [Intermediate 1-b] (15 g, 28 mmol) under a nitrogen atmosphere, and chilled to −30° C., followed by slow addition of drops of 1.7 M tert-butyl lithium pentane solution (32.8 mml, 56 mmol). After the dropwise addition, the mixture was heated to 60° C., stirred for 3 hours, and subjected to distillation to remove pentane. Drops of boron tribromide (14.0 g, 56 mmol) were added at −50° C. and stirred for 1 hour at room temperature. Addition of drops of N, N-diisoprophylethylamine (7.2 g, 56 mmol) at 0° C. was followed by stirring for 2 hours at 120° C. After completion of the reaction, tert-butylbenzene was removed by vacuum distillation. Following extraction with ethyl acetate and water, the organic layer was concentrated and isolated by column chromatography to afford [Compound 1]. (3.5 g, yield 25%)

MS (MALDI-TOF): m/z 511.19 [M$^+$]

Synthesis Example 2

Synthesis Example 2-1: Synthesis of [Intermediate 2-a]

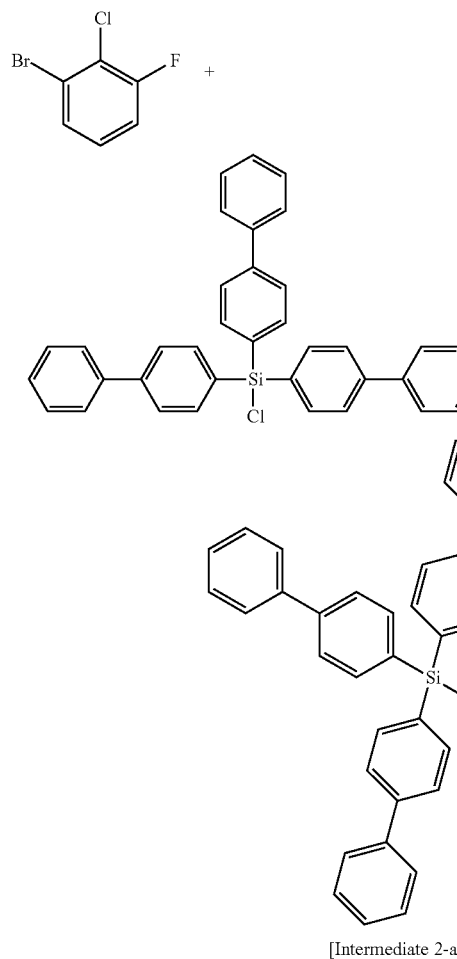

[Intermediate 2-a]

The same procedure as in Synthesis Example 1-1 was carried out, with the exception of using 1-bromo-2-chloro-3-fluorobenzene and tri(biphenyl-4-yl)silyl chloride instead of 1-bromo-2,3-dichlorobenzene and triphylsilyl chloride, respectively, to afford [Intermediate 2-a]. (yield 45%)

Synthesis Example 2-2. Synthesis of [Intermediate 2-b]

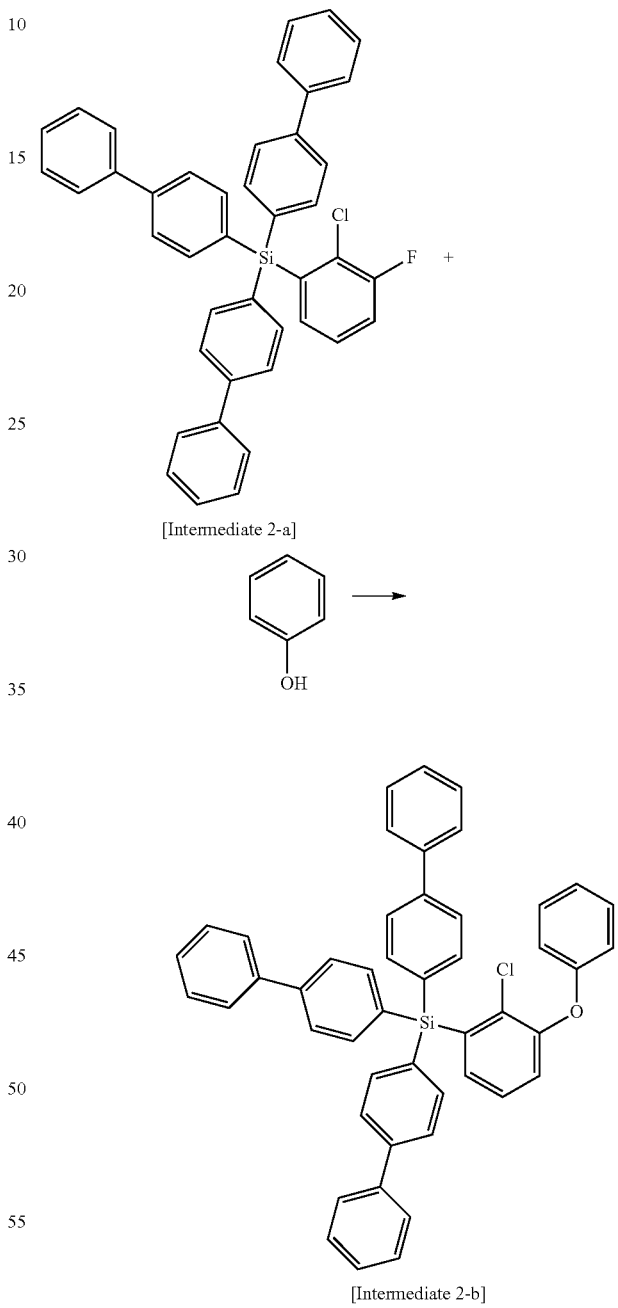

[Intermediate 2-b]

In a nitrogen atmosphere, phenol (38 g, 405 mmol), [Intermediate 2-a] (250 g, 405 mmol), and potassium carbonate (80.7 g, 583 mmol) W were added to 1-methyl-2-pyrrolidinone (500 ml) and the mixture was stirred at 150° C. for 12 hours. After completion of the reaction, the organic layer was concentrated in a vacuum and isolated by column chromatography to afford [Intermediate 2-b]. (71.5 g, 65%)

Synthesis Example 2-3: Synthesis of [Compound 40]

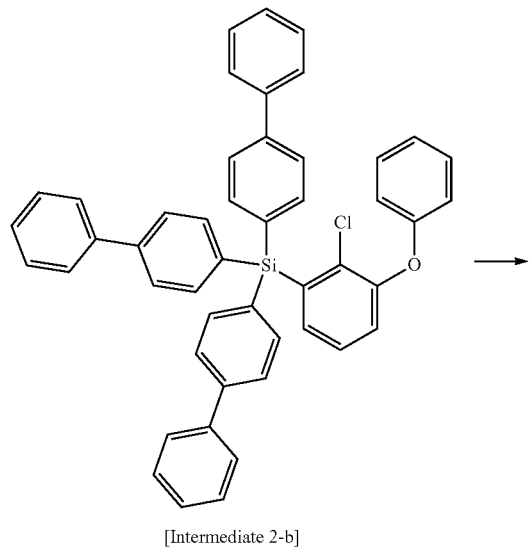

[Intermediate 2-b]

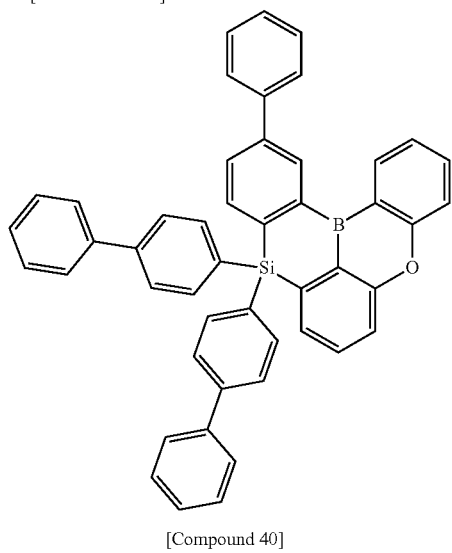

[Compound 40]

The same procedure as in Synthesis Example 1-3 was carried out, with the exception of using [Intermediate 2-b] instead of [Intermediate 1-b], to synthesize [Compound 40]. (yield 28%)

MS (MALDI-TOF): m/z 664.24 [M$^+$]

Synthesis Example 3

Synthesis Example 3-1: Synthesis of [Intermediate 3-a]

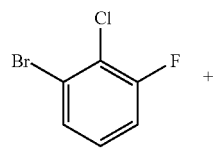

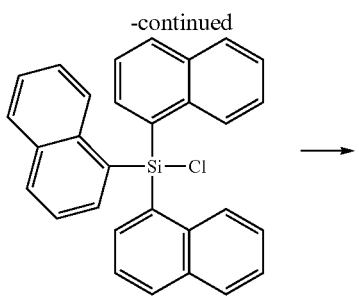 

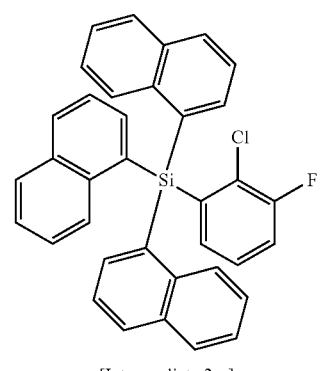

[Intermediate 3-a]

The same procedure as in Synthesis Example 1-1 was carried out, with the exception of using 1-bromo 2-chloro-3-fluorobenzene and chloro-tri-naphthylsilane instead of 1-bromo-2,3-dichlorobenzene and phenyl silyl chloride, respectively, to afford [Intermediate 3-a]. (yield 37%)

Synthesis Example 3-2: Synthesis of [Intermediate 3-b]

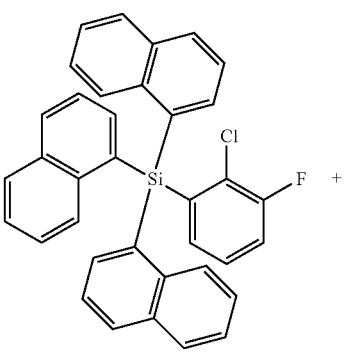

[Intermediate 3-a]

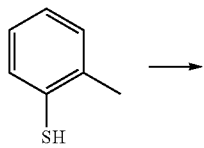 

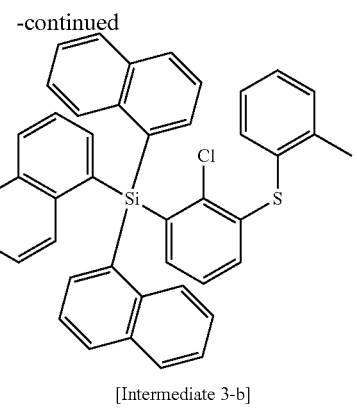

[Intermediate 3-b]

The same procedure as in Synthesis Example 2-2 was carried out, with the exception of using thiocresol instead of phenol, to afford [Intermediate 3-b]. (yield 49%)

Synthesis Example 3-3. Synthesis of [Compound 77]

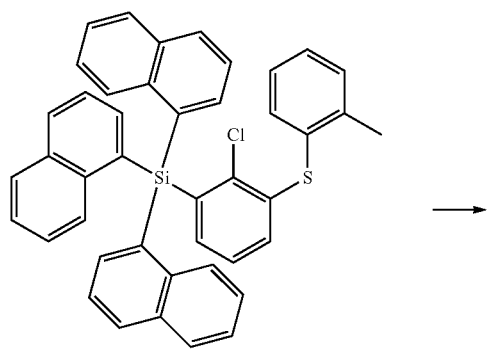

[Intermediate 3-b]

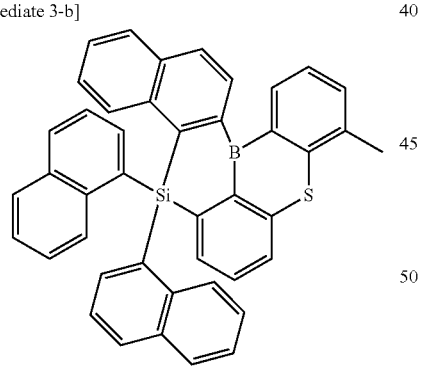

[Compound 77]

The same procedure as in Synthesis Example 1-3 was carried out, with the exception of using [Intermediate 3-b] instead of [Intermediate 1-b], to afford [Compound 77]. (yield 36%)

MS (MALDI-TOF): m/z 616.19 [M⁺]

Examples 1-7: Fabrication of Organic Light-Emitting Diodes

An ITO glass substrate was patterned to have a translucent area of 2 mm×2 mm and cleansed. The ITO glass was mounted in a vacuum chamber that was then set to have a base pressure of $1\times10^{-7}$ torr. On the ITO glass substrate, films were sequentially formed of DNTPD (700 Å) and [Chemical Formula H] (300 Å). Subsequently, a light-emitting layer (250 Å) was formed of a combination of [Chemical Formula BH1] and the compound (3 wt %) of the present disclosure. Then, [Chemical Formula E-1] and [Chemical Formula E-2] was deposited at a weight ratio of 1:1 to form an electron transport layer (300 Å) on which an electron injection layer of [Chemical Formula E-1] (5 Å) was formed and then covered with an Al layer (1000 Å) to fabricate an organic light-emitting diode. The organic light-emitting diodes thus obtained were measured at 0.4 mA for luminescence properties:

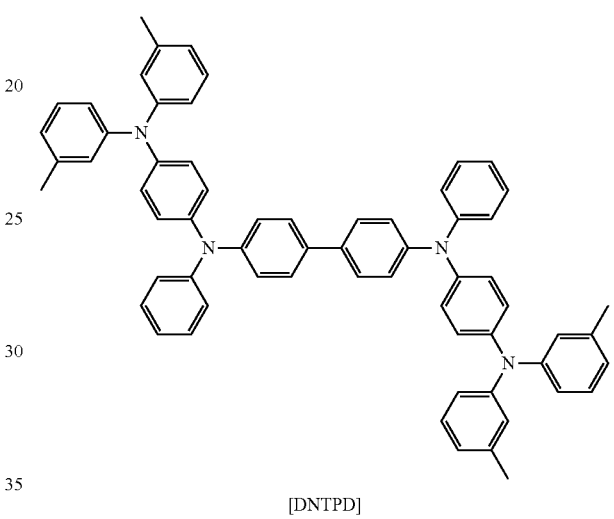

-continued

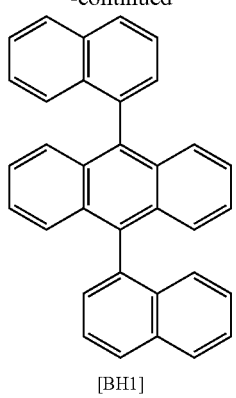

[BH1]

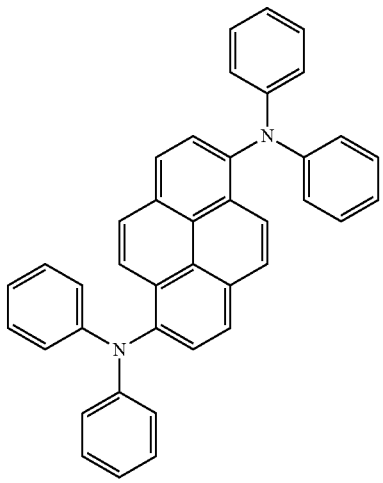

[BD1]

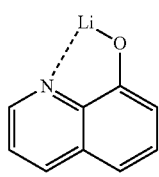

[Chemical Formula E-1]

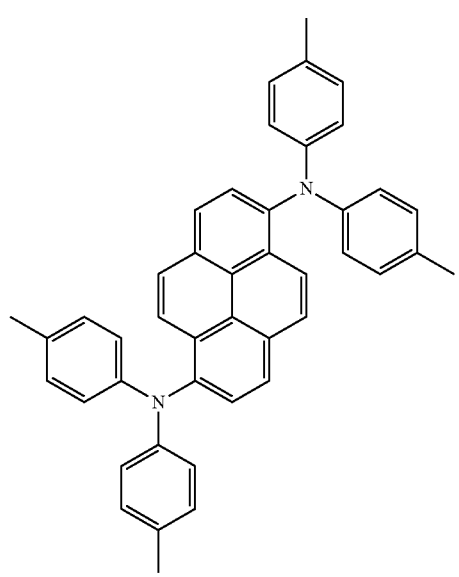

[BD2]

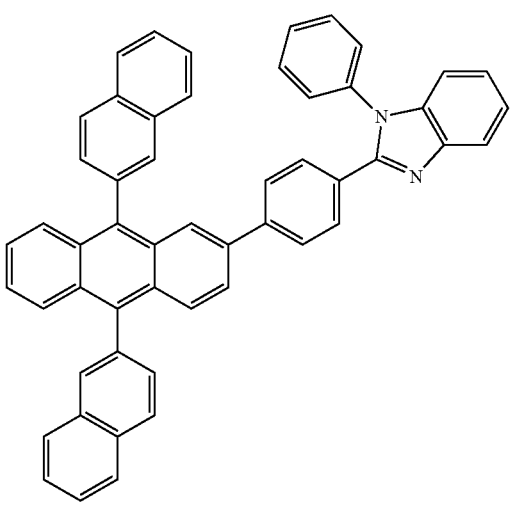

[Chemical Formula E-2]

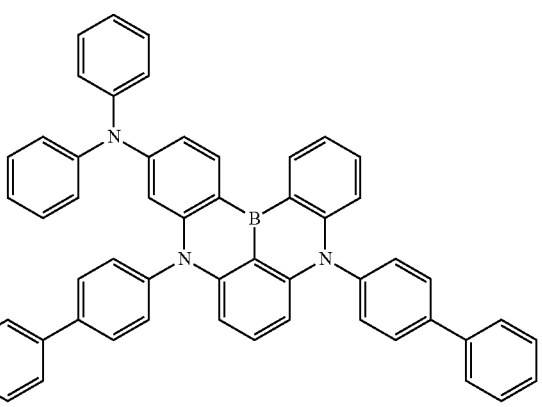

[BD3]

Comparative Examples 1-3

Organic light emitting diodes were fabricated in the same manner as in the Examples 1-5, with the exception of using [BD1], [BD2], or [BD3] instead of the compounds according to the present disclosure. The luminescence of the organic light-emitting diodes thus obtained was measured at 0.4 mA. Structures of compounds [BD1] to [BD3] are as follows:

The organic light emitting diodes fabricated in Examples 1 to 7 and Comparative Examples 1 to 3 were measured for driving voltage and external quantum efficiency, and the results are summarized in Table 1, below. The measurement was made at a current density of 10 mA/cm$^2$.

TABLE 1

| | Dopant | Current Density (mA/cm$^2$) | Volt. (V) | External Quantum Efficiency (%) | T90 (hr) |
|---|---|---|---|---|---|
| 1 | Compound 1 | 10 | 3.77 | 9.30 | 180 |
| 2 | Compound 2 | 10 | 3.79 | 9.28 | 177 |
| 3 | Compound 16 | 10 | 3.81 | 9.34 | 183 |
| 4 | Compound 23 | 10 | 3.65 | 9.17 | 180 |
| 5 | Compound 40 | 10 | 3.72 | 9.37 | 171 |
| 6 | Compound 48 | 10 | 3.94 | 9.25 | 168 |
| 7 | Compound 77 | 10 | 3.68 | 9.31 | 175 |
| C. 1 | BD1 | 10 | 4.17 | 7.5 | 142 |
| C. 2 | BD2 | 10 | 4.22 | 7.1 | 137 |
| C. 3 | BD3 | 10 | 4.15 | 5.8 | 88 |

As is understood from data of Table 1, the organic light-emitting diodes according to Examples 1 to 7 of the present disclosure exhibit excellent luminous efficiency, low driving voltages, and long lifespans, compared to those of the Comparative Examples 1 to 3 and thus are industrially applicable.

The invention claimed is:

1. A boron compound represented by the following Chemical Formula A:

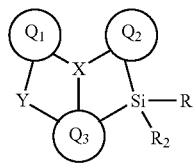

[Chemical Formula A]

wherein, $Q_1$ to $Q_3$, which may be the same or different, are each independently a substituted or unsubstituted aromatic hydrocarbon ring of 6 to 50 carbon atoms, or a substituted or unsubstituted heteroaromatic ring of 2 to 50 carbon atoms, Y is any one selected from N-$R_3$, C$R_4R_5$, O, and S, X is B, and $R_1$ to $R_5$, which may be the same or different, are each independently any one selected from a hydrogen atom, a deuterium, a substituted or unsubstituted alkyl of 1 to 30 carbon atoms, a substituted or unsubstituted aryl of 6 to 50 carbon atoms, a substituted or unsubstituted cycloalkyl of 3 to 30 carbon atoms, a substituted or unsubstituted heteroaryl of 2 to 50 carbon atoms, a substituted or unsubstituted arylamine of 5 to 30 carbon atoms, a substituted or unsubstituted alkylsilyl of 1 to 30 carbon atoms, a substituted or unsubstituted arylsilyl of 5 to 30 carbon atoms, a nitro, a cyano, and a halogen, wherein $R_1$ and $R_2$ may be connected to each other to form an additional mono- or polycyclic aliphatic or aromatic ring, and $R_4$ and $R_5$ may be connected to each other to form an additional mono- or polycyclic aliphatic or aromatic ring, wherein, the term "substituted" in the expression "substituted or unsubstituted" used for compounds of Chemical Formulas A means having at least one substituent selected from the group consisting of a deuterium atom, a cyano, a halogen, a nitro, an alkyl of 1 to 24 carbon atoms, a halogenated alkyl of 1 to 24 carbon atoms, an aryl of 6 to 24 carbon atoms, an arylalkyl of 7 to 24 carbon atoms, an alkylaryl of 7 to 24 carbon atoms, a heteroaryl of 2 to 50 carbon atoms, an arylamino of 6 to 24 carbon atoms, a heteroarylamino of 1 to 24 carbon atoms, an alkylsilyl of 1 to 24 carbon atoms, and an arylsilyl of 6 to 24 carbon atoms.

2. The boron compound of claim 1, wherein Y in Chemical Formula A is N-$R_3$ wherein $R_3$ is as defined in claim 1.

3. The boron compound of claim 2, wherein $R_3$ is a substituted or unsubstituted aryl of 6 to 50 carbon atoms or a substituted or unsubstituted heteroaryl of 2 to 50 carbon atoms.

4. The boron compound of claim 1, wherein Y in Chemical Formula A is a linker represented by the following Structural Formula A:

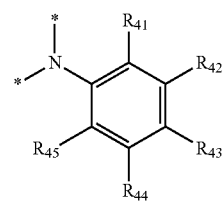

[Structural Formula A]

wherein "-*" denotes a bonding site at which the linker Y bonds to an aromatic carbon atom within the $Q_1$ and $Q_3$ ring moieties, $R_{41}$ to $R_{45}$, which are same or different, are each independently any one selected from a hydrogen atom, a deuterium atom, a substituted or unsubstituted alkyl of 1 to 30 carbon atoms, a substituted or unsubstituted aryl of 6 to 50 carbon atoms, a substituted or unsubstituted cycloalkyl of 3 to 30 carbon atoms, a substituted or unsubstituted heteroaryl of 2 to 50 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a substituted or unsubstituted arylamine of 5 to 30 carbon atoms, a substituted or unsubstituted alkylsilyl of 1 to 30 carbon atoms, a substituted or unsubstituted arylsilyl of 5 to 30 carbon atoms, a nitro, a cyano, and a halogen.

5. The boron compound of claim 1, wherein Y in Chemical Formula A is an oxygen (O) atom.

6. The boron compound of claim 1, wherein the $Q_1$ to $Q_3$ ring moieties, which are same or different, are each independently a substituted or unsubstituted aromatic hydrocarbon ring of 6 to 50 carbon atoms.

7. The boron compound of claim 6, wherein the aromatic hydrocarbon ring moieties $Q_1$ and $Q_2$ in Chemical Formula A are each independently any one selected from compounds represented by the following Structural Formulas 10 to 18:

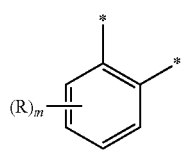

[Structural Formula 10]

-continued

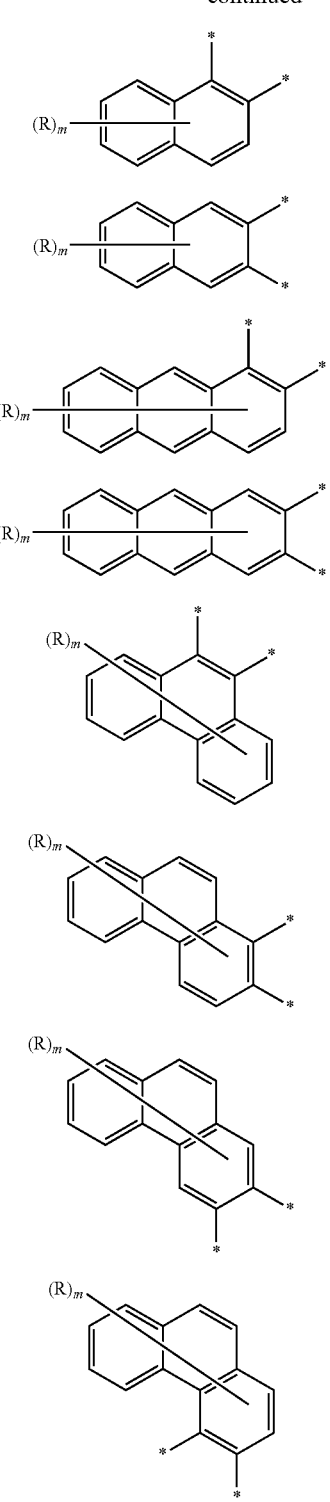

[Structural Formula 11]

[Structural Formula 12]

[Structural Formula 13]

[Structural Formula 14]

[Structural Formula 15]

[Structural Formula 16]

[Structural Formula 17]

[Structural Formula 18]

wherein, "-*" denotes a bonding site at which a carbon atom in the aromatic ring of $Q_1$ or $Q_2$ bonds to X, the linker Y, or the silicon atom (Si), R's, which are same or different, are each independently a hydrogen, a deuterium, a substituted or unsubstituted alkyl of 1 to 30 carbon atoms, a substituted or unsubstituted aryl of 6 to 50 carbon atoms, a substituted or unsubstituted cycloalkyl of 3 to 30 carbon atoms, a substituted or unsubstituted heteroaryl of 2 to 50 carbon atoms, a substituted or unsubstituted alkylamine of 1 to 30 carbon atoms, a substituted or unsubstituted arylamine of 5 to 30 carbon atoms, a substituted or unsubstituted alkylsilyl of 1 to 30 carbon atoms, a substituted or unsubstituted arylsilyl of 5 to 30 carbon atoms, a cyano, and a halogen, and m is an integer of 1 to 8, wherein when m is two or more or two or more R's are present, the corresponding R's are same or different.

8. The boron compound of claim 6, wherein the aromatic hydrocarbon ring of $Q_3$ in Chemical Formula A is a ring represented by the following Structural Formula B:

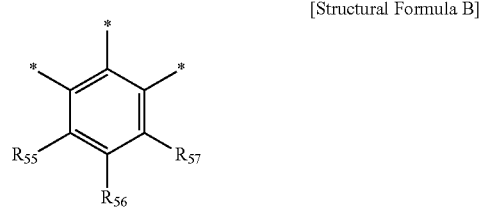

[Structural Formula B]

wherein "-*" denotes bonding sites at which the corresponding carbons in the aromatic ring of $Q_3$ bond to, X, the linker Y, and the silicon atom (Si), respectively, and $R_{55}$ to $R_{57}$, which are same or different, are each independently any one selected from a hydrogen, a deuterium, a substituted or unsubstituted alkyl of 1 to 30 carbon atoms, a substituted or unsubstituted aryl of 6 to 50 carbon atoms, a substituted or unsubstituted cycloalkyl of 3 to 30 carbon atoms, a substituted or unsubstituted heteroaryl of 2 to 50 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a substituted or unsubstituted arylamine of 5 to 30 carbon atoms, a substituted or unsubstituted alkylsilyl of 1 to 30 carbon atoms, a substituted or unsubstituted arylsilyl of 5 to 30 carbon atoms, a cyano, and a halogen, and any adjacent two of $R_{55}$ to $R_{57}$ can be linked to each to each other to form an additional mono- or polycyclic aliphatic or aromatic ring.

9. The boron compound of claim 1, wherein the boron compound is any one selected from the following <Compound 1> to <Compound 33>, <Compound 37> to <Compound 54>, and <Compound 56> to <Compound 86>:

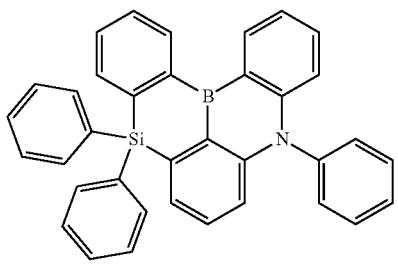

<Compound 1>

<Compound 2>
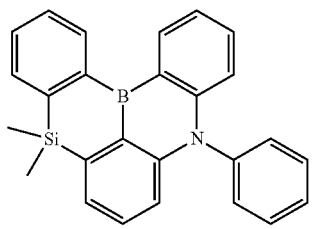
<Compound 3>
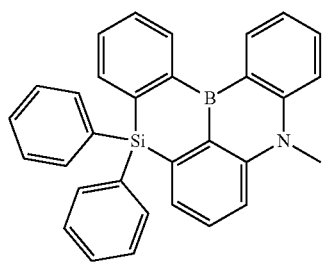
<Compound 4>
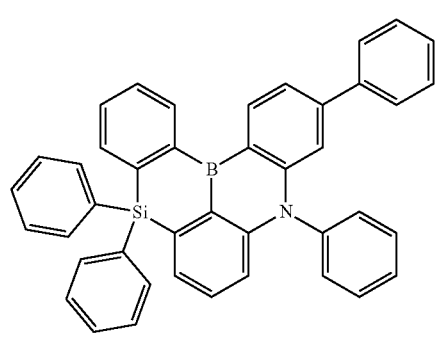
<Compound 5>
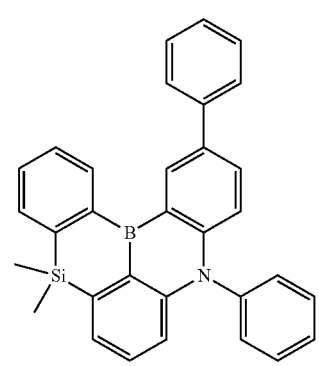
<Compound 6>
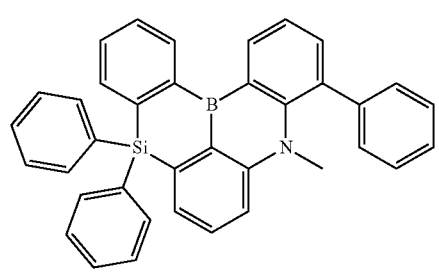
<Compound 7>
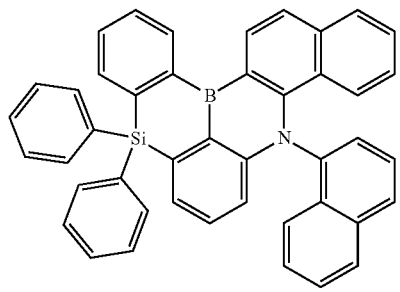
<Compound 8>
<Compound 9>
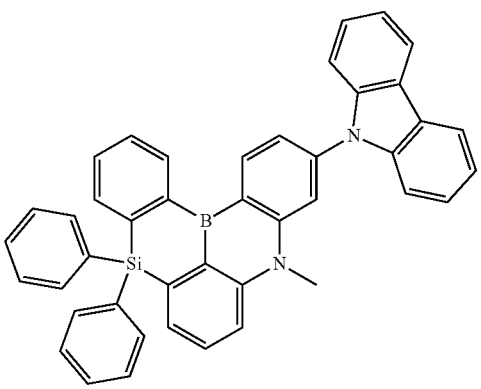
<Compound 10>
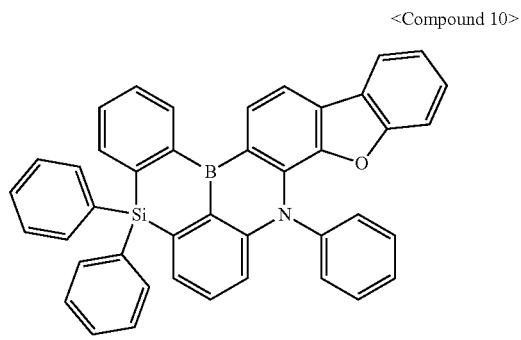

<Compound 11>
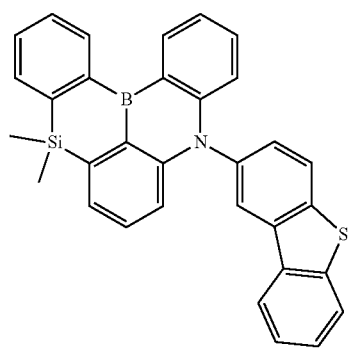
<Compound 12>
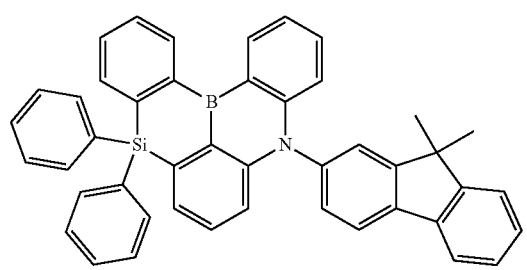
<Compound 13>
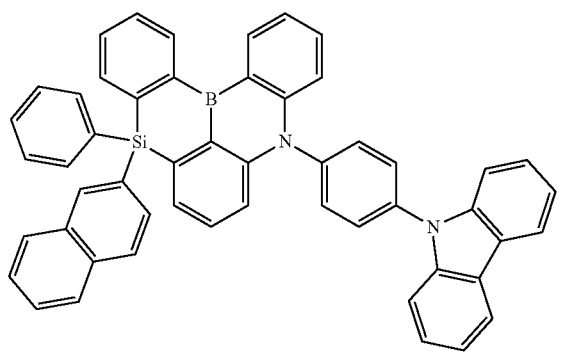
<Compound 14>
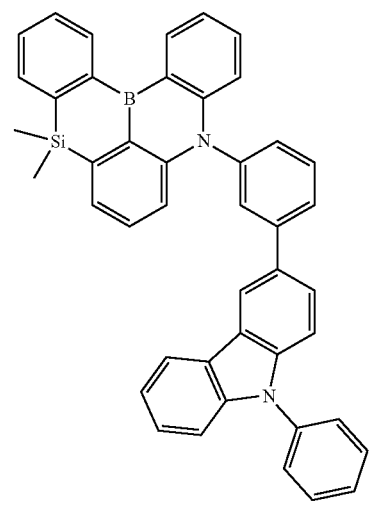
<Compound 15>
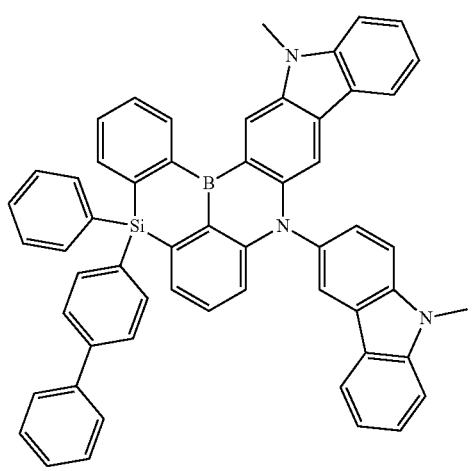
<Compound 16>
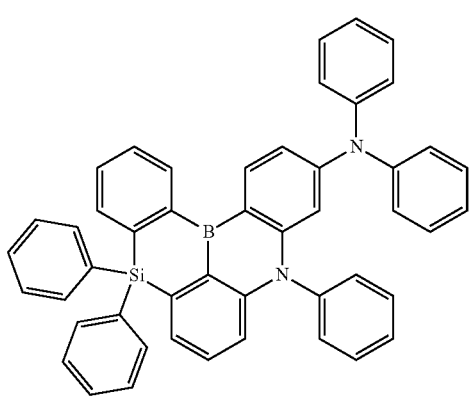
<Compound 17>
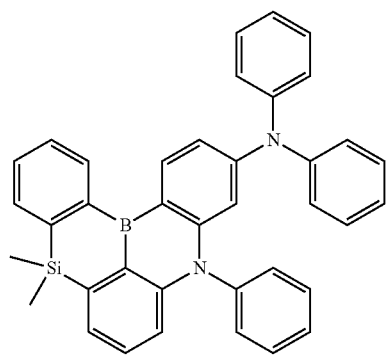

<Compound 18>
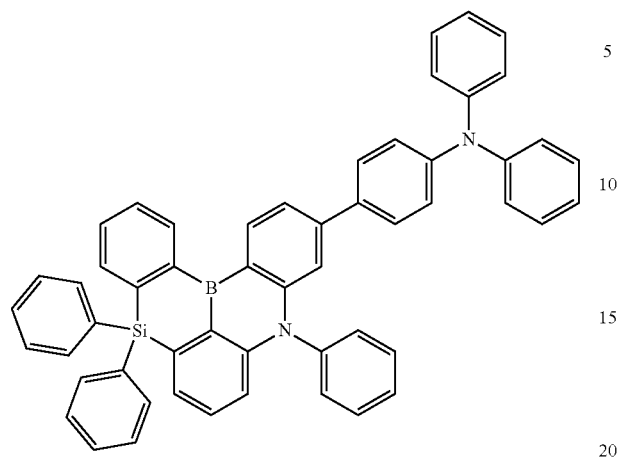
<Compound 19>
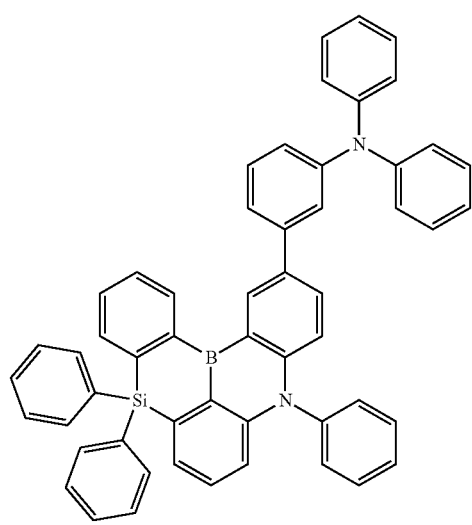
<Compound 20>
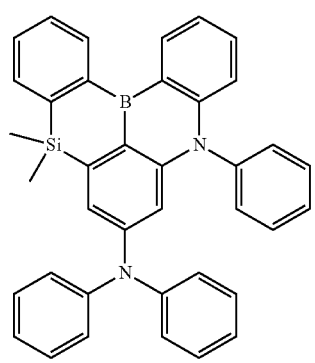
<Compound 21>
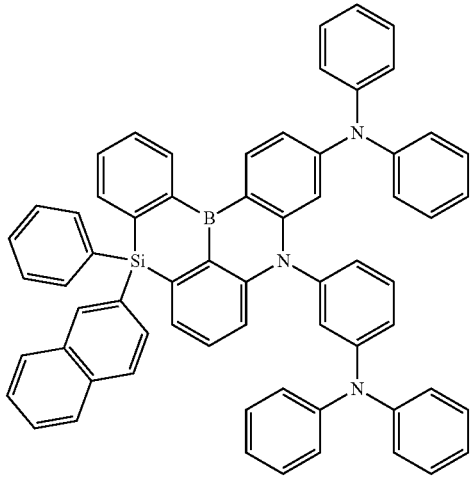
<Compound 22>
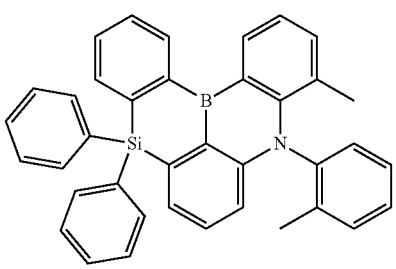
<Compound 23>
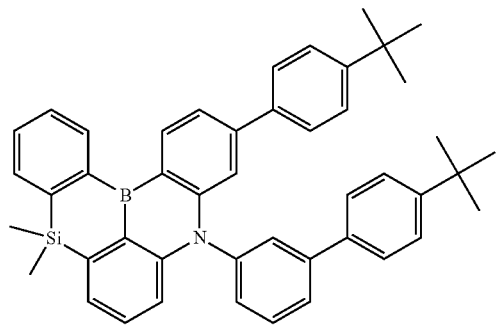
<Compound 24>
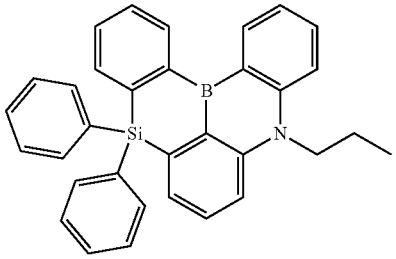
<Compound 25>
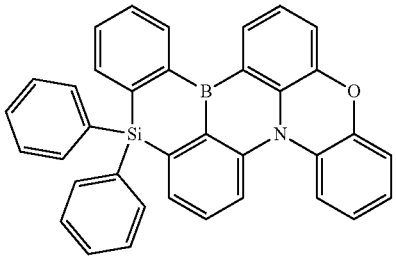

-continued
<Compound 26>
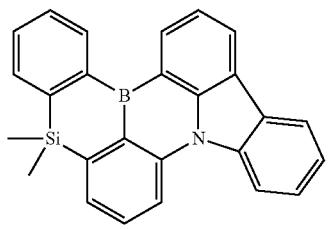
<Compound 27>
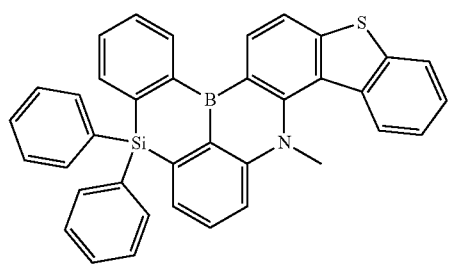
<Compound 28>
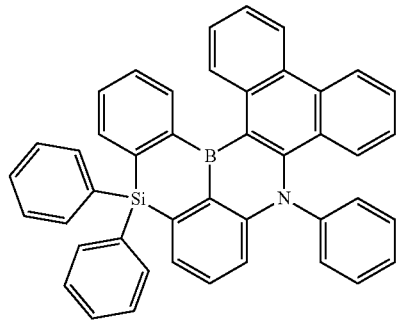
<Compound 29>
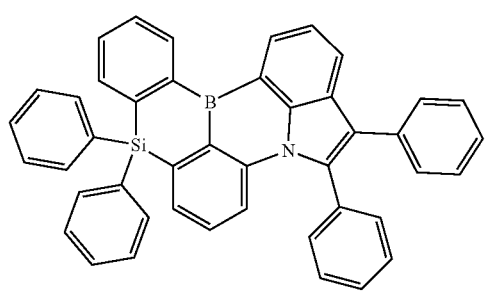
<Compound 30>
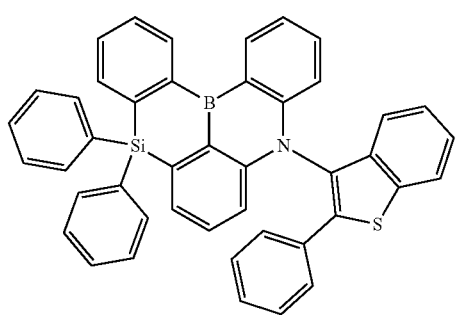
-continued
<Compound 31>
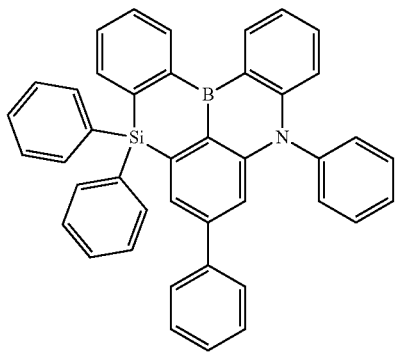
<Compound 32>
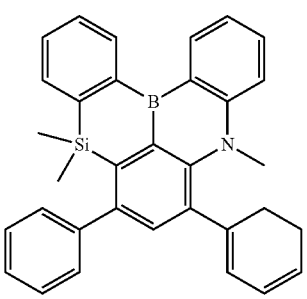
<Compound 33>
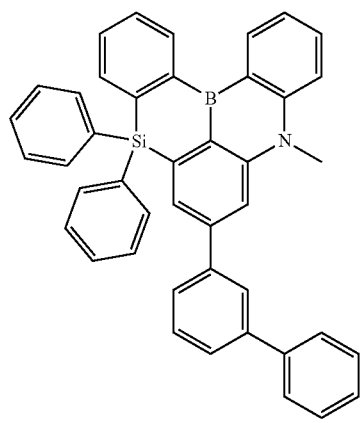
<Compound 37>
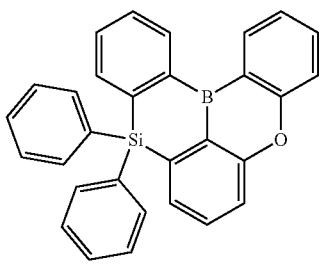
<Compound 38>
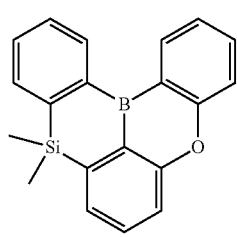

<Compound 39>
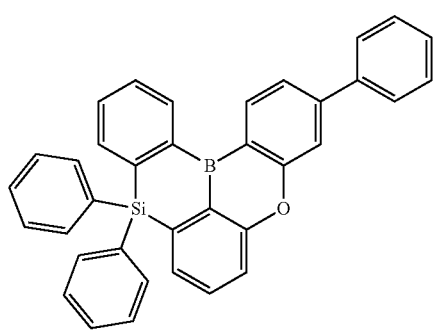
<Compound 40>
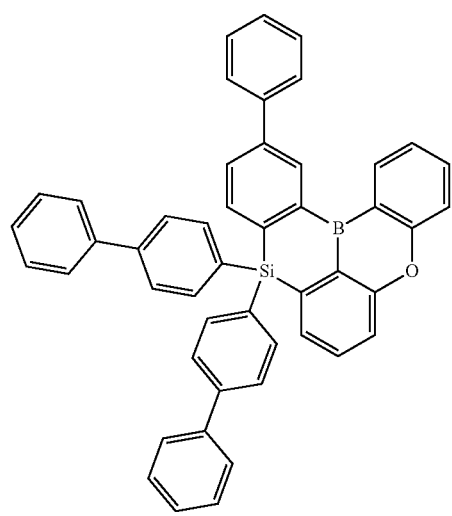
<Compound 41>
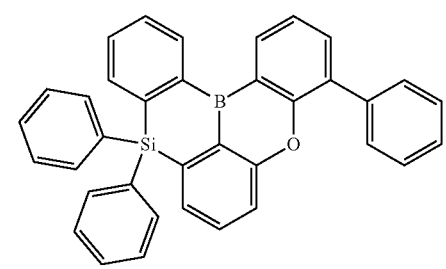
<Compound 42>
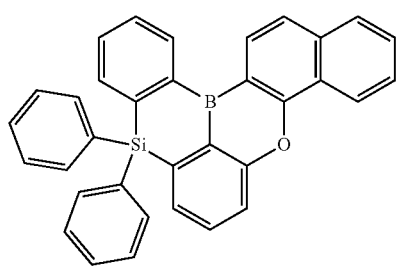
<Compound 43>
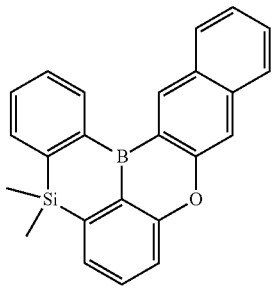
<Compound 44>
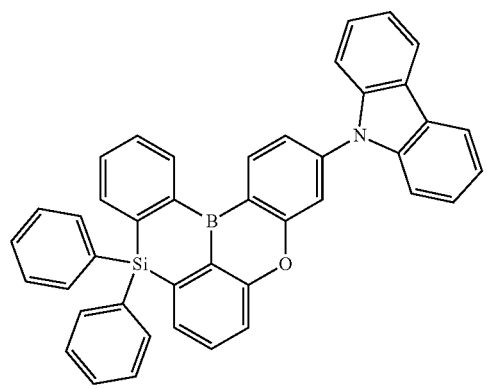
<Compound 45>
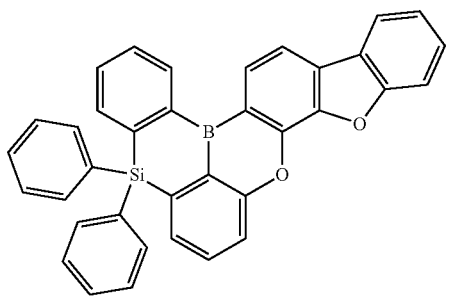
<Compound 46>
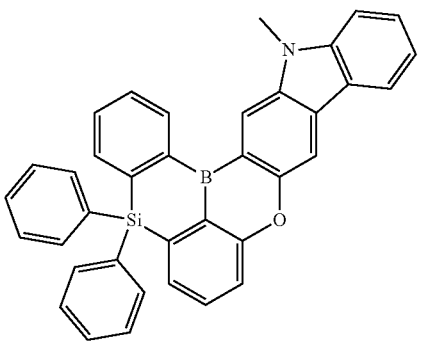
<Compound 47>
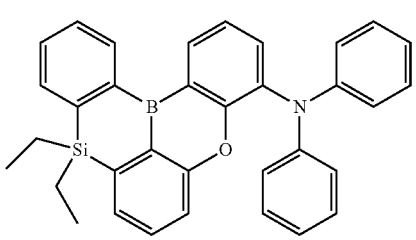

-continued
<Compound 48>
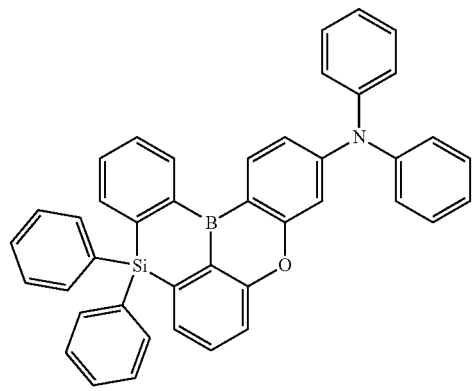
<Compound 49>
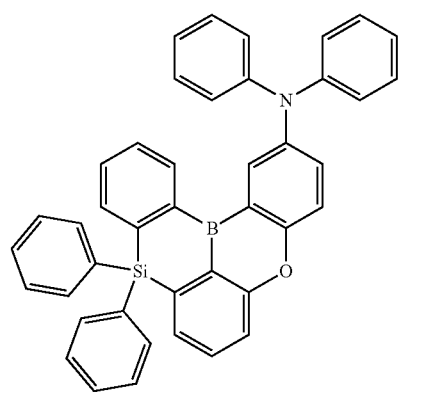
<Compound 50>
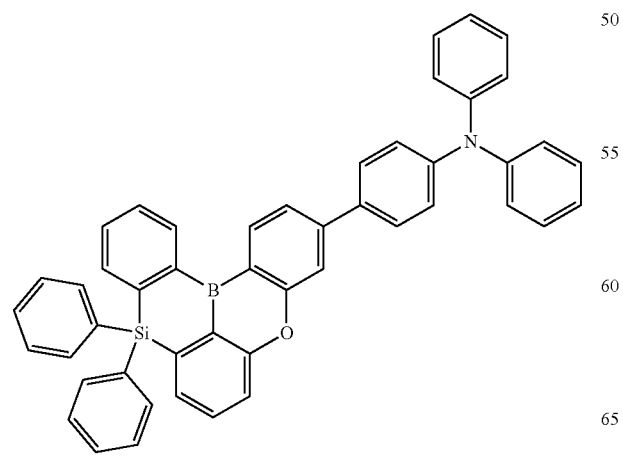
<Compound 51>
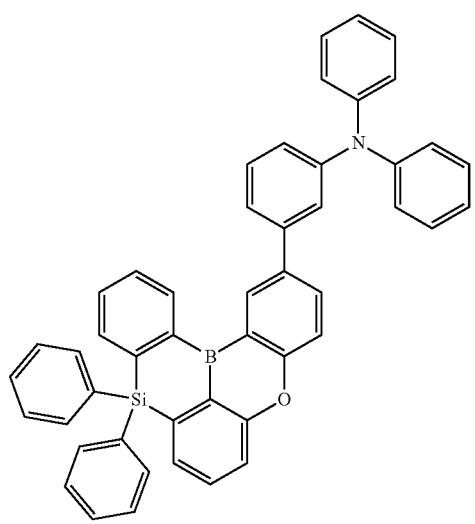
<Compound 52>
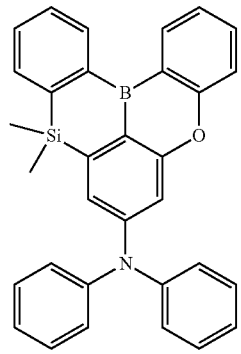
<Compound 53>
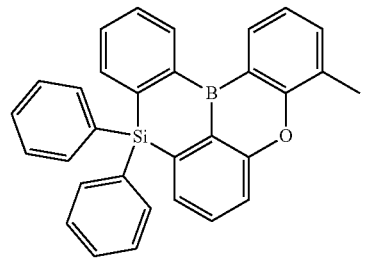
<Compound 54>
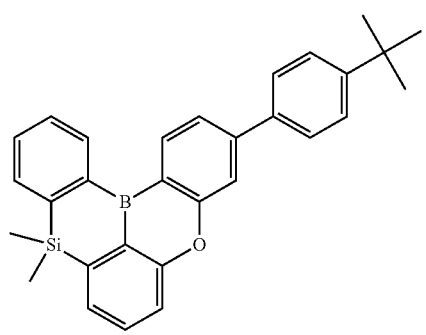

<Compound 56>
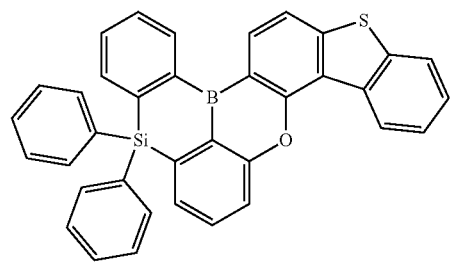
<Compound 57>
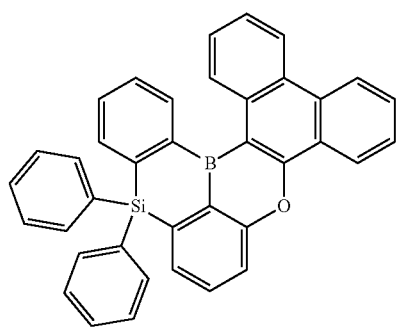
<Compound 58>
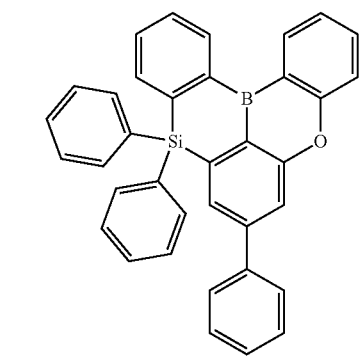
<Compound 59>
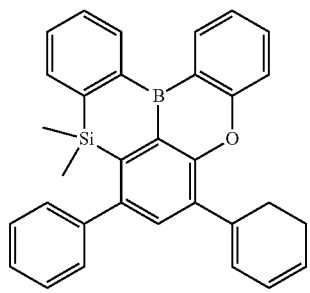
<Compound 60>
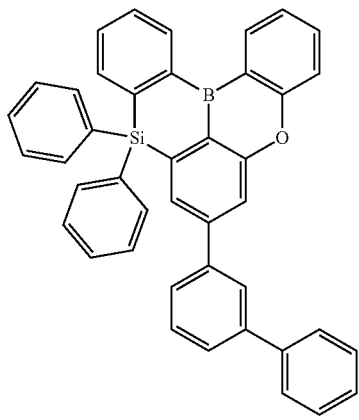
<Compound 61>
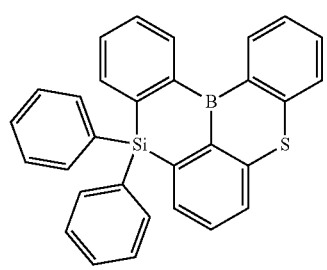
<Compound 62>
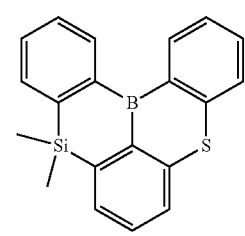
<Compound 63>
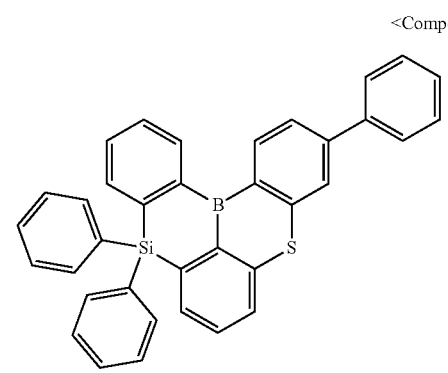
<Compound 64>
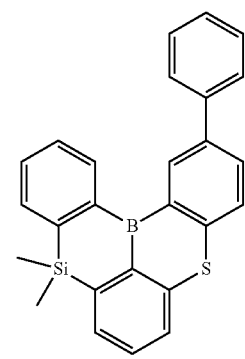

<Compound 65>
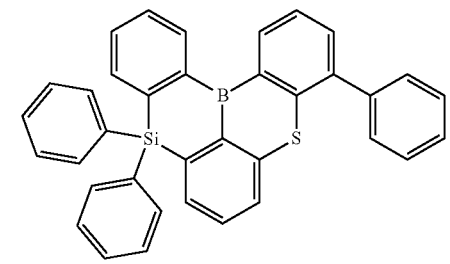
<Compound 66>
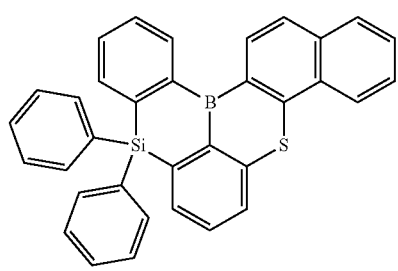
<Compound 67>
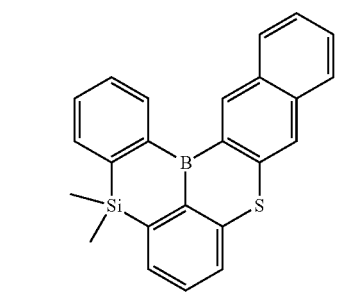
<Compound 68>
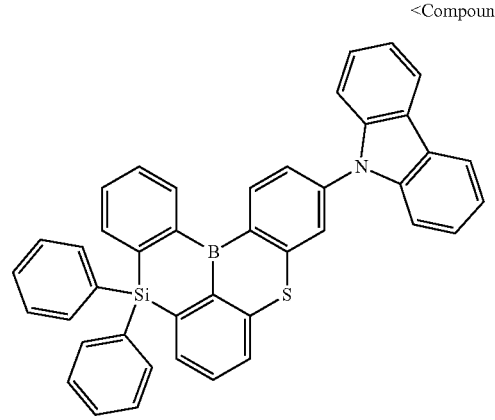
<Compound 69>
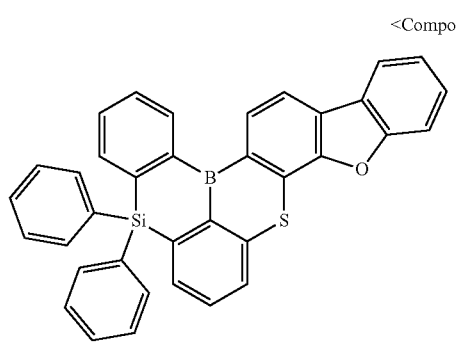
<Compound 70>
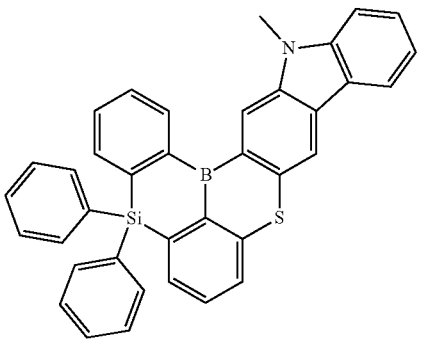
<Compound 71>
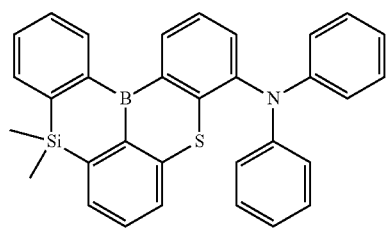
<Compound 72>
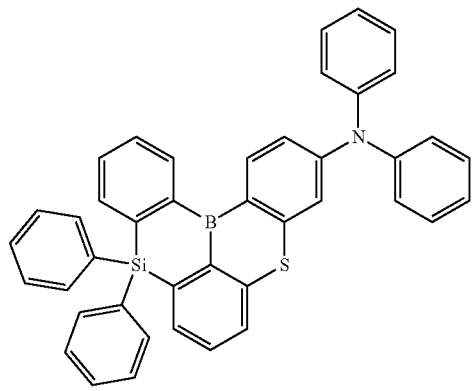
<Compound 73>
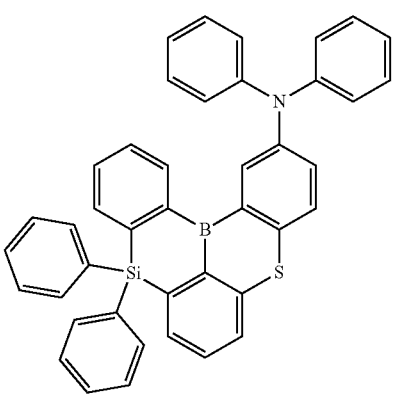

-continued
<Compound 74>
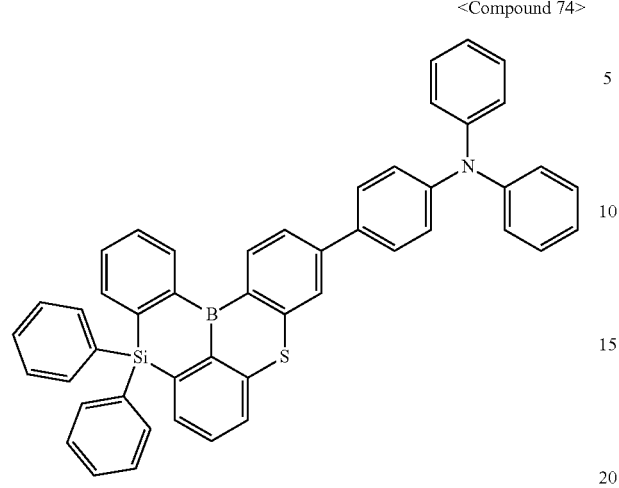
<Compound 75>
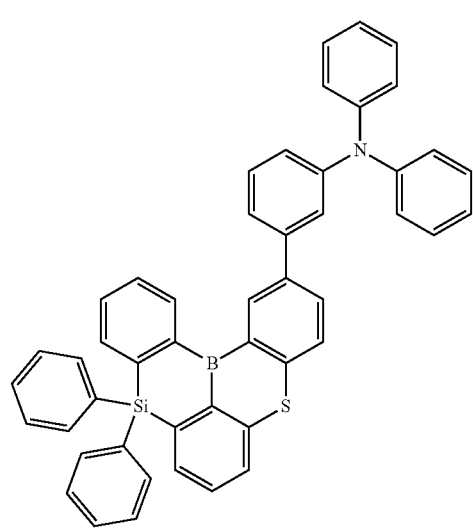
<Compound 76>
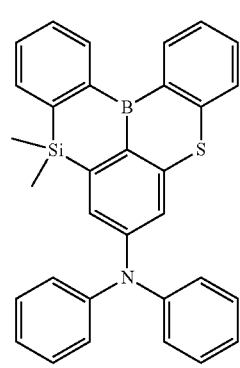
<Compound 77>
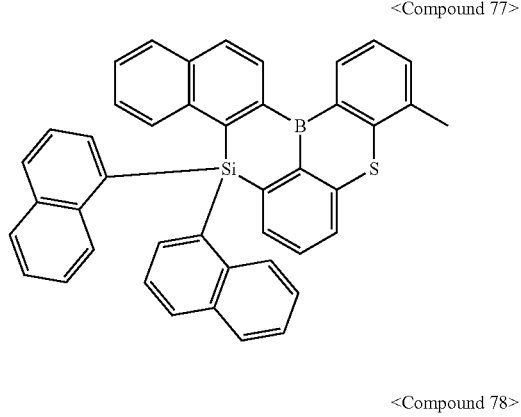
<Compound 78>
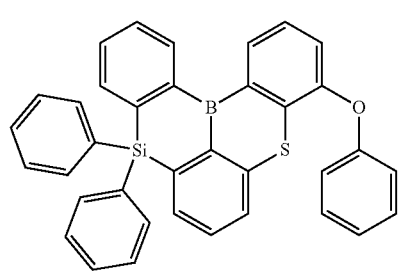
<Compound 79>
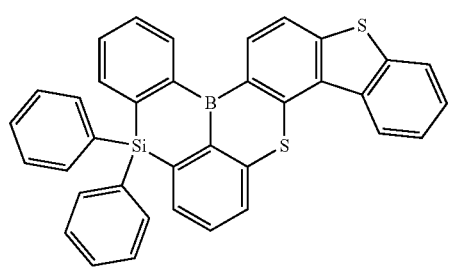
<Compound 80>
<Compound 81>
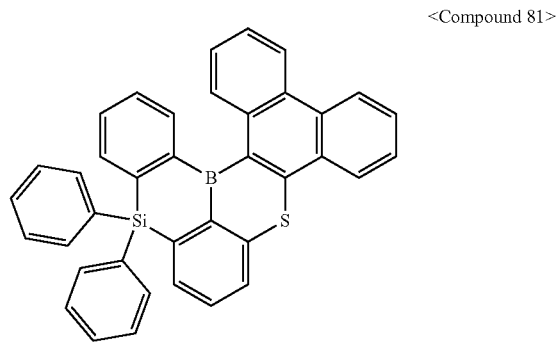

<Compound 82>
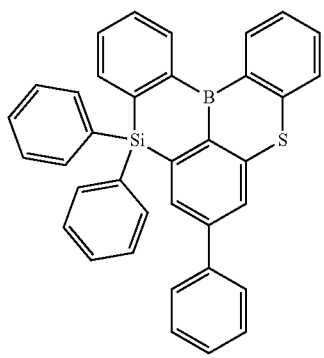

<Compound 83>
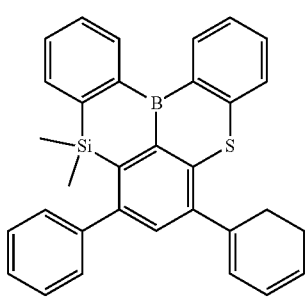

<Compound 84>
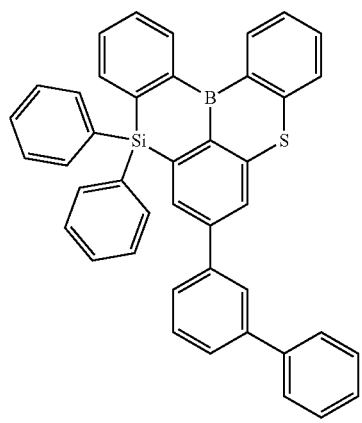

<Compound 85>
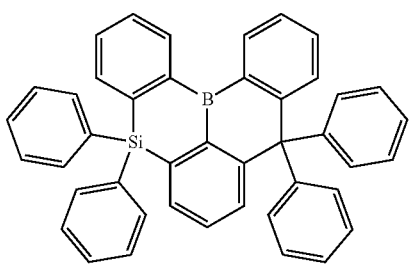

<Compound 86>
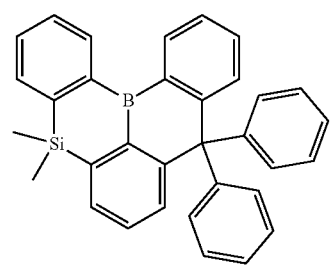

10. An organic light-emitting diode, comprising:
a first electrode;
a second electrode facing the second electrode; and
an organic layer interposed between the first electrode and the second electrode, wherein the organic layer includes the boron compound of claim 1.

11. The organic light-emitting diode of claim 10, wherein the organic layer comprises at least one of a hole injection layer, a hole transport layer, a functional layer capable of both hole injection and hole transport, a light-emitting layer, an electron transport layer, and an electron injection layer.

12. The organic light-emitting diode of claim 11, wherein the organic layer disposed between the first electrode and the second electrode includes a light-emitting layer composed of a host and a dopant, the boron compound represented by Chemical Formula A servings as the dopant.

13. The organic light-emitting diode of claim 12, wherein the light-emitting layer uses an anthracene derivative represented by the following Chemical Formula C as the host:

[Chemical Formula C]

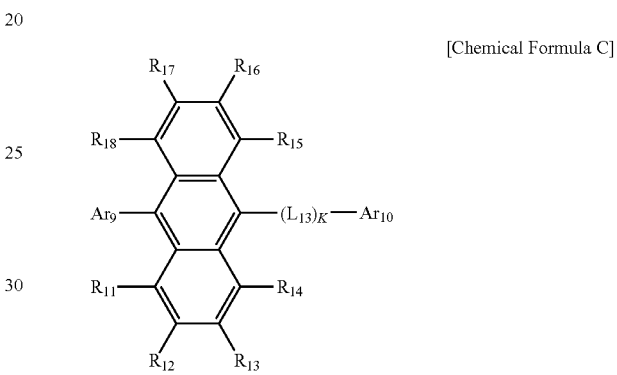

wherein,
$R_{11}$ to $R_{18}$, which are same or different, are each as defined for $R_1$ to $R_5$ in claim 1;
$Ar_9$ and $Ar_{10}$, which are same or different, are each independently any one selected from a hydrogen atom, a deuterium atom, a substituted or unsubstituted alkyl of 1 to 30 carbon atoms, a substituted or unsubstituted aryl of 6 to 50 carbon atoms, a substituted or unsubstituted cycloalkyl of 3 to 30 carbon atoms, a substituted or unsubstituted heteroaryl of 2 to 50 carbon atoms, a substituted or unsubstituted alkylsilyl of 1 to 30 carbon atoms, and a substituted or unsubstituted arylsilyl of 6 to 30 carbon atoms;
$L_{13}$, which functions as a linker, is a single bond or is selected from a substituted or unsubstituted arylene of 6 to 20 carbon atoms, and a substituted or unsubstituted heteroarylene of 2 to 20 carbon atoms; and
k is an integer of 1 to 3, wherein when k is 2 or greater, the corresponding $L_{13}$'s are same or different.

14. The organic light-emitting diode of claim 13, wherein $Ar_9$ in Chemical Formula C is a substituent represented by the following Chemical Formula C-1:

[Chemical Formula C-1]

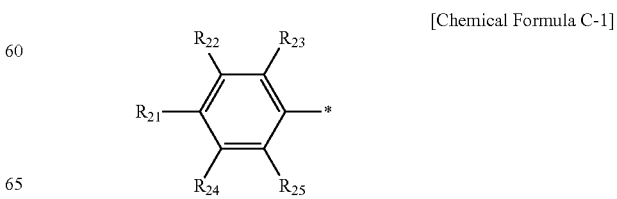

wherein, $R_{21}$ to $R_{25}$, which are same or different, are as defined for $R_1$ to $R_5$ in claim 1; and can each be linked to an adjacent one to form a saturated or unsaturated cyclic ring.

15. The organic light-emitting diode of claim 13, wherein $L_{13}$ is a single bond or a substituted or unsubstituted arylene of 6 to 20 carbon atoms, and k is 1 or 2, with the proviso that when k is 2, corresponding $L_{13}$'s are same or different.

16. The organic light-emitting diode of claim 13, wherein the anthracene derivative is any one selected from the compounds represented by the following [Chemical Formula C1] to [Chemical Formula C48]:

<Chemical Formula C1>

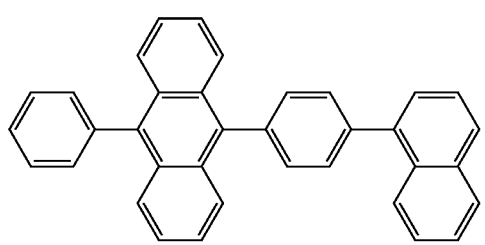

<Chemical Formula C2>

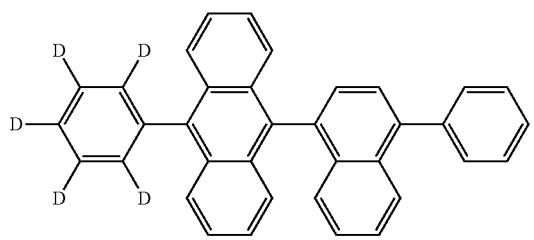

<Chemical Formula C3>

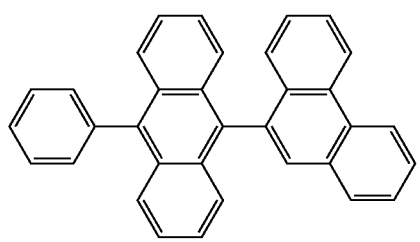

<Chemical Formula C4>

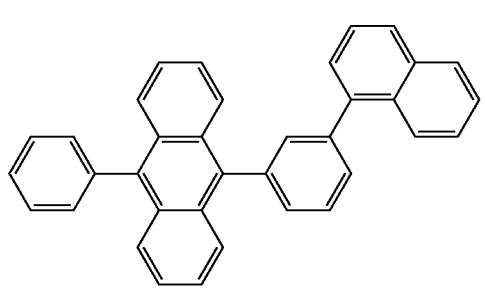

<Chemical Formula C5>

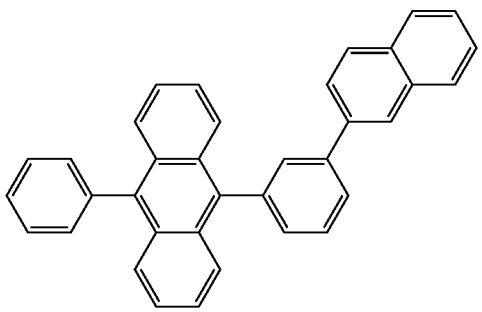

<Chemical Formula C6>

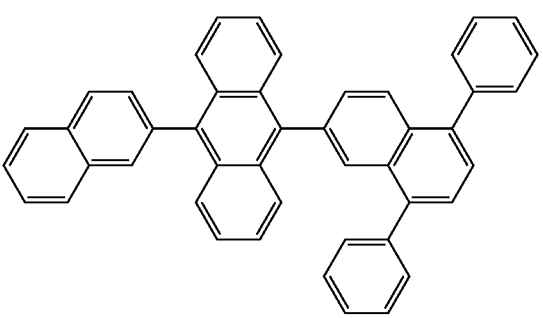

<Chemical Formula C7>

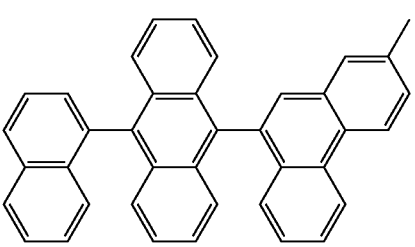

<Chemical Formula C8>

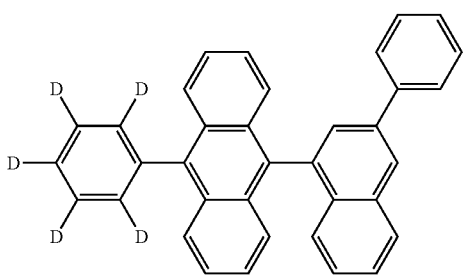

<Chemical Formula C9>

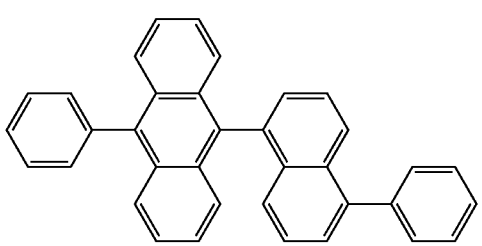

<Chemical Formula C10>
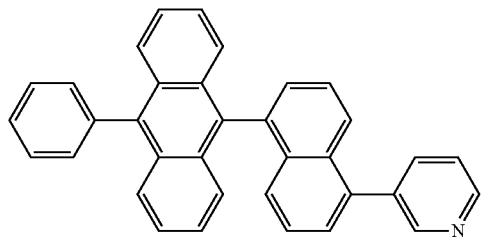
<Chemical Formula C11>
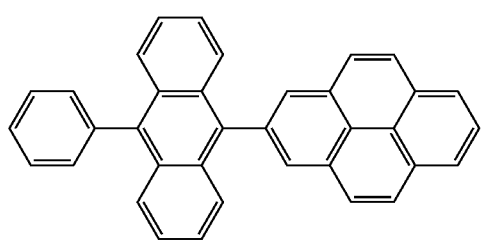
<Chemical Formula C12>
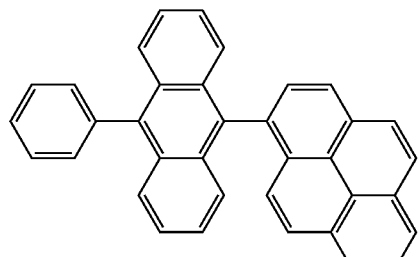
<Chemical Formula C13>
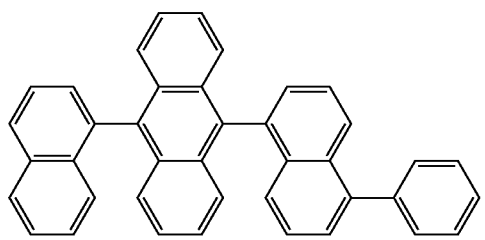
<Chemical Formula C14>
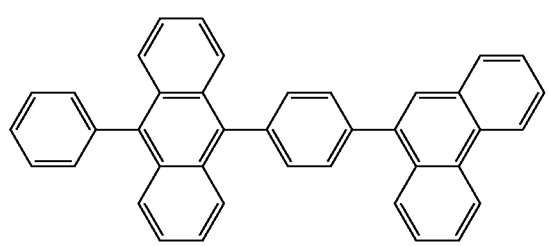
<Chemical Formula C15>
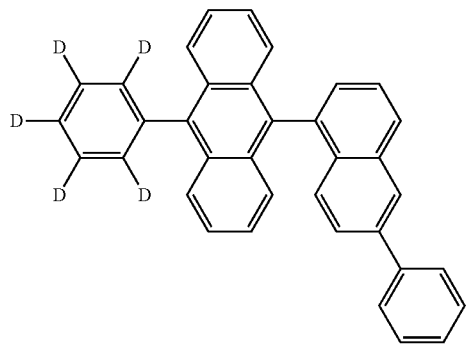
<Chemical Formula C16>
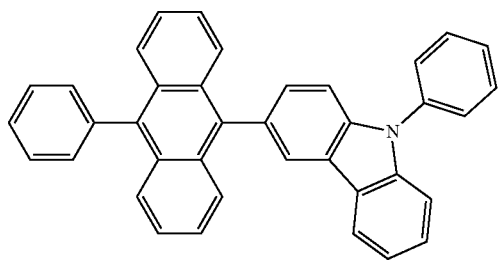
<Chemical Formula C17>
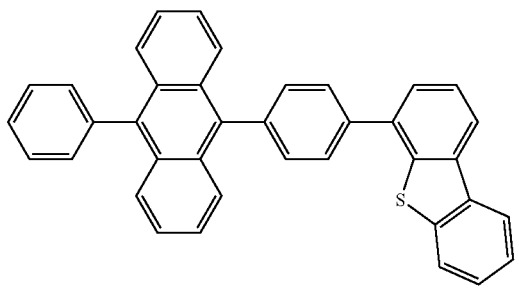
<Chemical Formula C18>
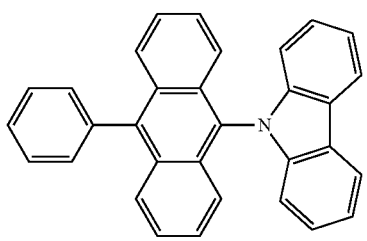
<Chemical Formula C19>
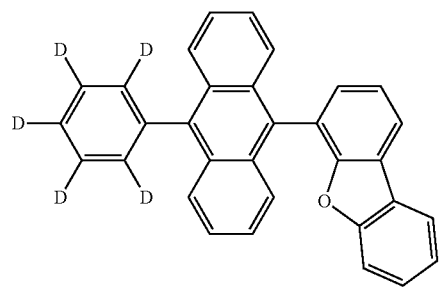

<Chemical Formula C20>
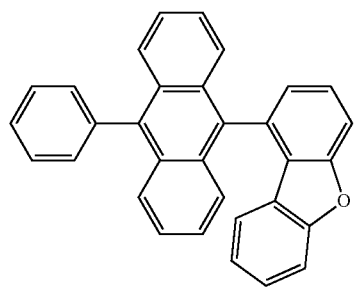
<Chemical Formula C21>
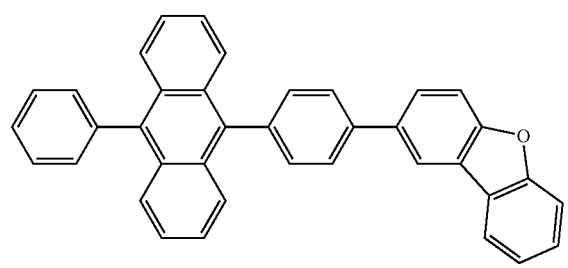
<Chemical Formula C22>
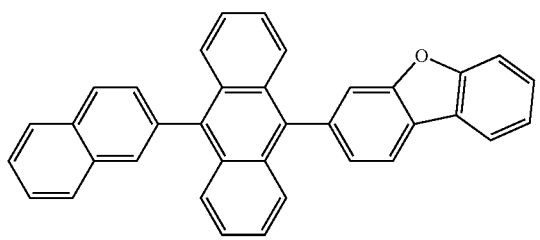
<Chemical Formula C23>
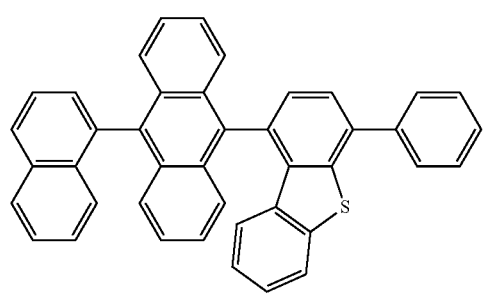
<Chemical Formula C24>
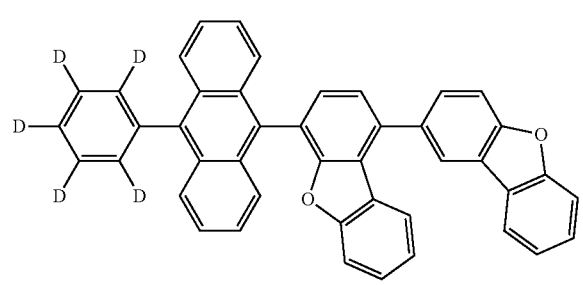
<Chemical Formula C25>
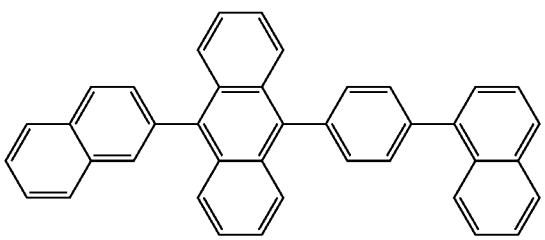
<Chemical Formula C26>
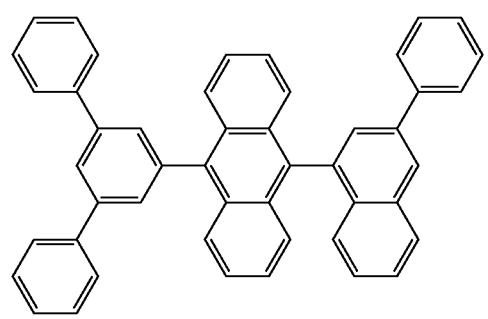
<Chemical Formula C27>
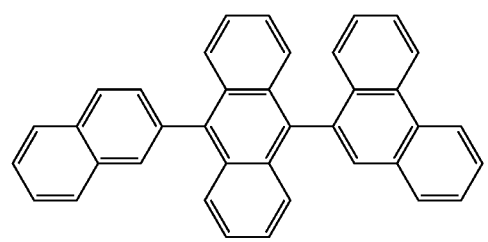
<Chemical Formula C28>
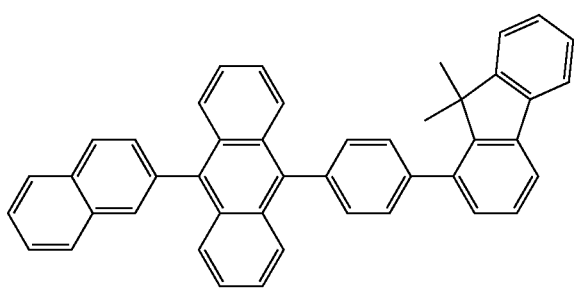
<Chemical Formula C29>
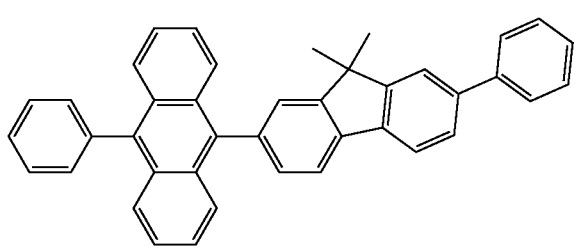

<Chemical Formula C30>
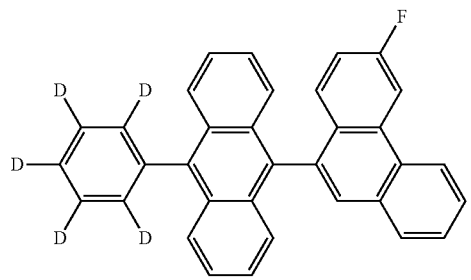
<Chemical Formula C31>
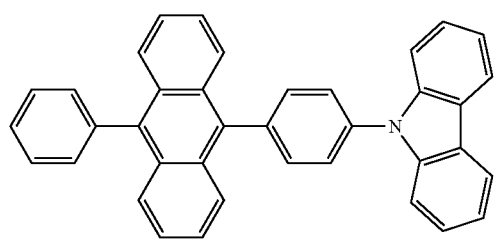
<Chemical Formula C32>
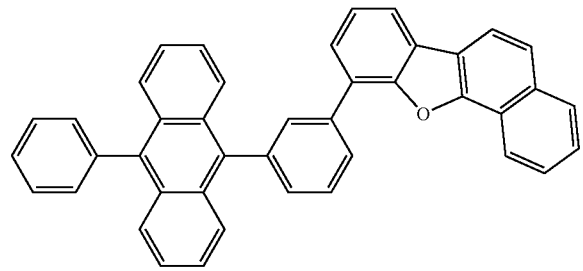
<Chemical Formula C33>
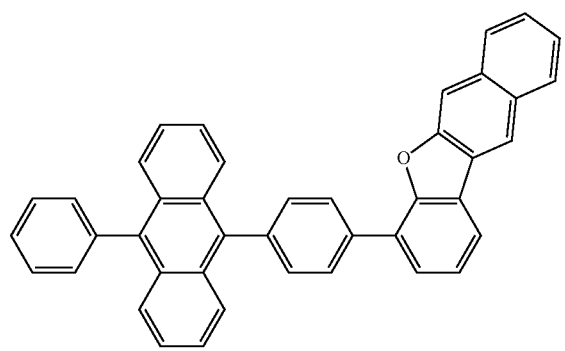
<Chemical Formula C34>
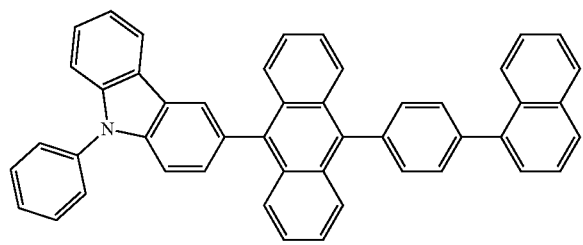
<Chemical Formula C35>
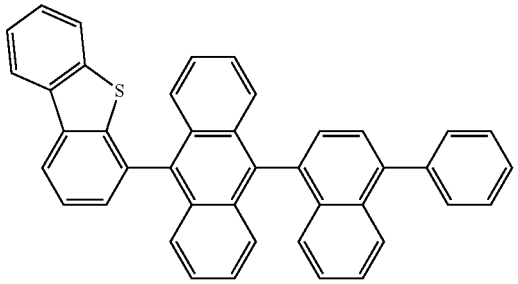
<Chemical Formula C36>
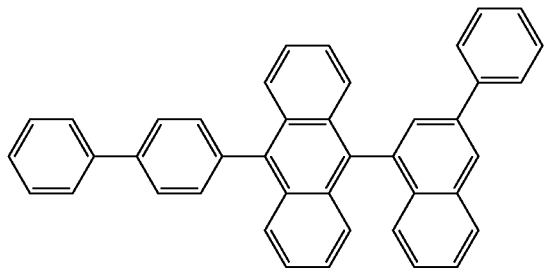
<Chemical Formula C37>
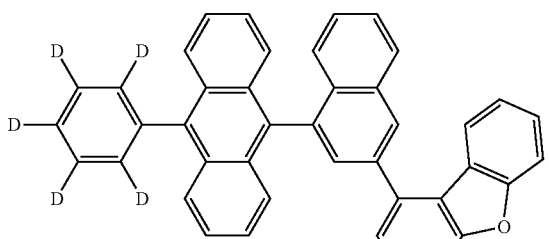
<Chemical Formula 38>
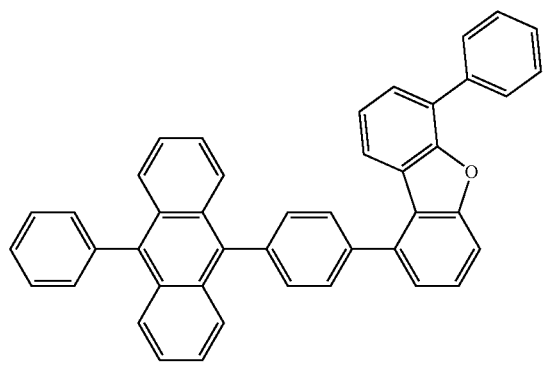
<Chemical Formula 39>
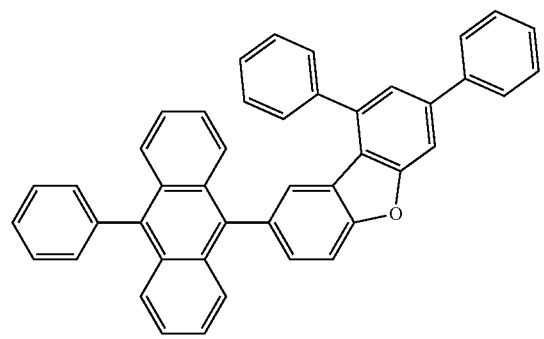

-continued
<Chemical Formula 40>
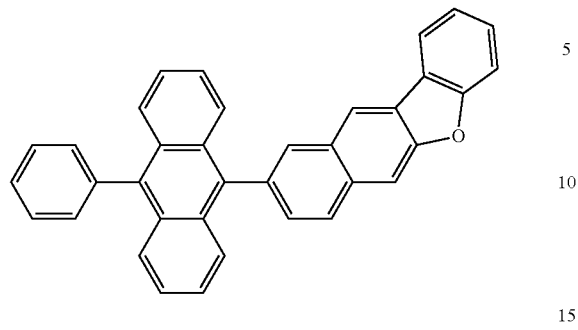
<Chemical Formula 41>
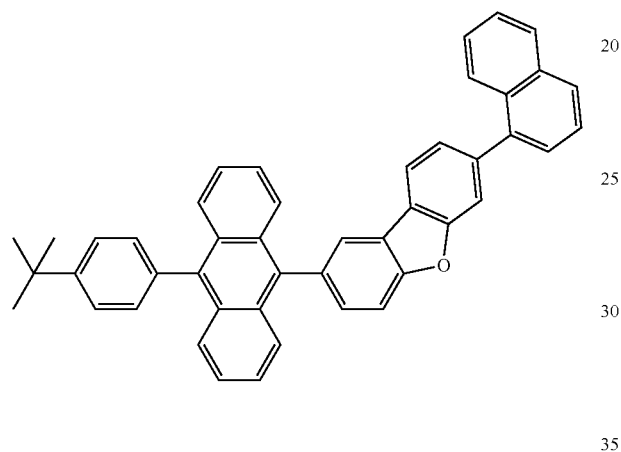
<Chemical Formula C42>
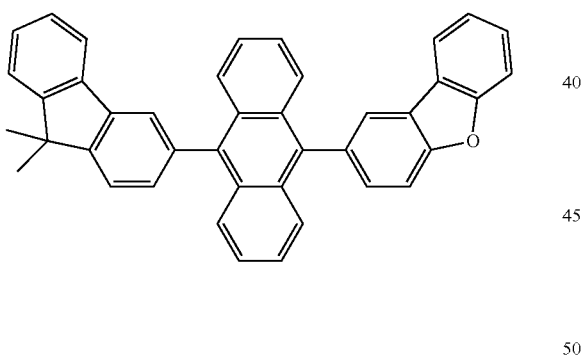
<Chemical Formula C43>
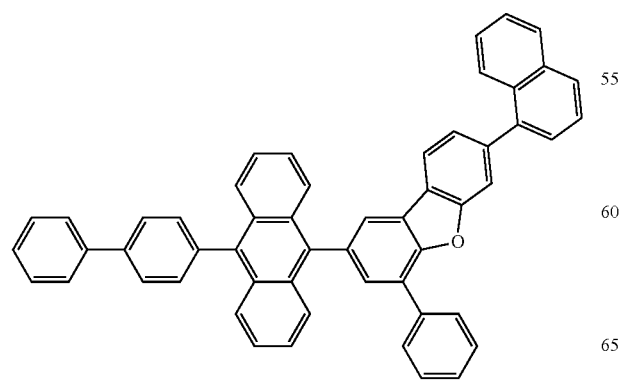
-continued
<Chemical Formula C44>
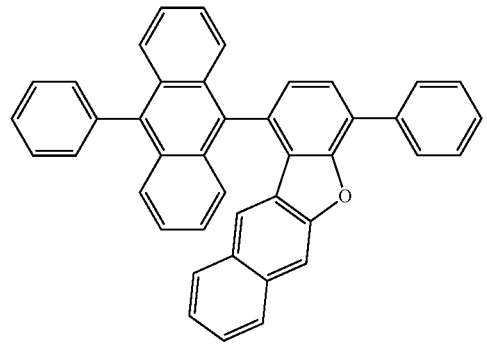
<Chemical Formula C45>
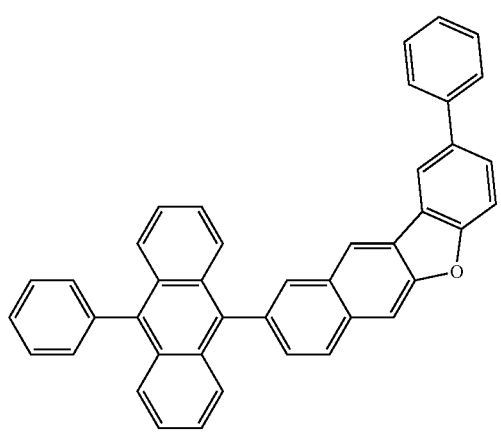
<Chemical Formula C46>
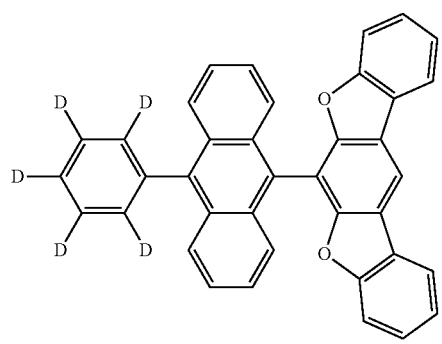
<Chemical Formula C47>
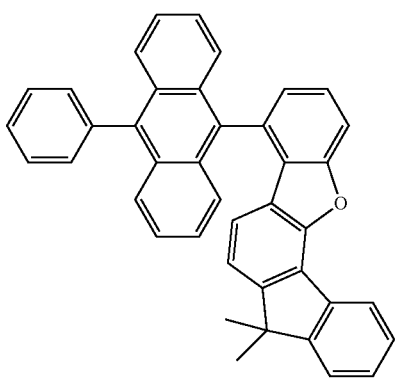

-continued

<Chemical Formula C48>

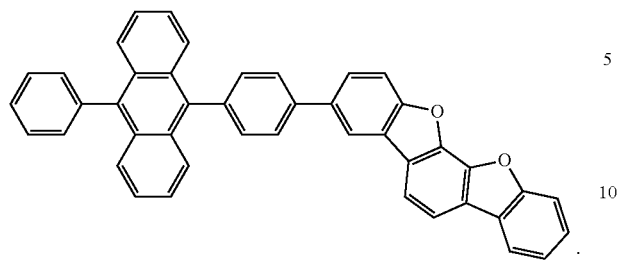

17. The organic light-emitting diode of claim 11, wherein at least one selected from among the layers is deposited using a single-molecule deposition process or a solution process.

18. The organic light-emitting diode of claim 10, wherein the organic light-emitting diode is used for a device selected from among a flat display device; a flexible display device; a monochrome or grayscale flat illumination; and a monochrome or grayscale flexible illumination device.

* * * * *